(12) United States Patent
Okumura

(10) Patent No.: US 12,040,361 B2
(45) Date of Patent: Jul. 16, 2024

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 413 days.

(21) Appl. No.: 17/533,855

(22) Filed: Nov. 23, 2021

(65) Prior Publication Data

US 2022/0238655 A1 Jul. 28, 2022

(30) Foreign Application Priority Data

Jan. 22, 2021 (JP) ................................ 2021-008857

(51) Int. Cl.
*H01L 29/10* (2006.01)
*H01L 29/16* (2006.01)
(Continued)

(52) U.S. Cl.
CPC .... *H01L 29/1095* (2013.01); *H01L 29/66734* (2013.01); *H01L 29/7813* (2013.01); *H01L 29/1608* (2013.01)

(58) Field of Classification Search
CPC ............. H01L 29/0623; H01L 29/0696; H01L 29/0878; H01L 29/0883; H01L 29/1095; H01L 29/1608; H01L 29/7813
(Continued)

(56) References Cited

U.S. PATENT DOCUMENTS 5,168,331 A 12/1992 Yilmaz
10,002,952 B2 6/2018 Sugahara et al.
(Continued)

FOREIGN PATENT DOCUMENTS

JP 2019-121716 A 7/2017
JP 6617657 B2 11/2019
(Continued)

OTHER PUBLICATIONS

Extended European Search Report dated Jul. 11, 2022 for European Application No. 22150690.0.
(Continued)

*Primary Examiner* — Fazli Erdem

(57) ABSTRACT

A semiconductor device includes n-type drift layer, n-type first current spreading layer on top surface of the drift layer, p-type base region on top surface of the first current spreading layer, p-type gate-bottom protection region inside the first current spreading layer, p-type base-bottom embedded region separated from the gate-bottom protection region and in contact with bottom surface of the base region, n-type second current spreading layer having side surface opposed to the gate-bottom protection region and in contact with side surface of the base-bottom embedded region, and insulated gate electrode structure inside trench penetrating the base region to reach the gate-bottom protection region. The impurity concentration ratio of the gate-bottom protection region to the first current spreading layer is greater than the impurity concentration ratio of the base-bottom embedded region to the second current spreading layer.

11 Claims, 29 Drawing Sheets

(51) Int. Cl.
*H01L 29/66* (2006.01)
*H01L 29/78* (2006.01)

(58) Field of Classification Search
USPC .......................................................... 257/77
See application file for complete search history.

(56) References Cited

U.S. PATENT DOCUMENTS

| | | | |
|---|---|---|---|
| 10,199,493 B2 | 2/2019 | Kinoshita et al. | |
| 10,217,858 B2 | 2/2019 | Hoshi | |
| 10,403,749 B2 | 9/2019 | Kinoshita et al. | |
| 10,600,864 B2 | 3/2020 | Kinoshita et al. | |
| 2017/0141223 A1 | 5/2017 | Hoshi | |
| 2018/0033876 A1 | 2/2018 | Sugahara et al. | |
| 2018/0197983 A1 | 7/2018 | Kinoshita et al. | |
| 2018/0350976 A1* | 12/2018 | Okumura | H01L 29/1608 |
| 2019/0140091 A1* | 5/2019 | Kinoshita | H01L 29/0623 |
| 2019/0165166 A1 | 5/2019 | Kinoshita et al. | |
| 2019/0181261 A1* | 6/2019 | Okumura | H01L 29/0623 |
| 2019/0214457 A1 | 7/2019 | Kinoshita et al. | |
| 2020/0303540 A1* | 9/2020 | Miyashita | H01L 29/66734 |

FOREIGN PATENT DOCUMENTS

| | | |
|---|---|---|
| JP | 6759563 B2 | 9/2020 |
| WO | 2017064949 A1 | 4/2017 |

OTHER PUBLICATIONS

T. Kimoto and J. A. Cooper, "Fundamentals of Silicon Carbide Technology: Growth, Characterization, Devices, and Applications", Appendix C: Major Physical Properties of Common SiC Polytypes, John Wiley & Sons, Sep. 2014, pp. 521-524.

* cited by examiner

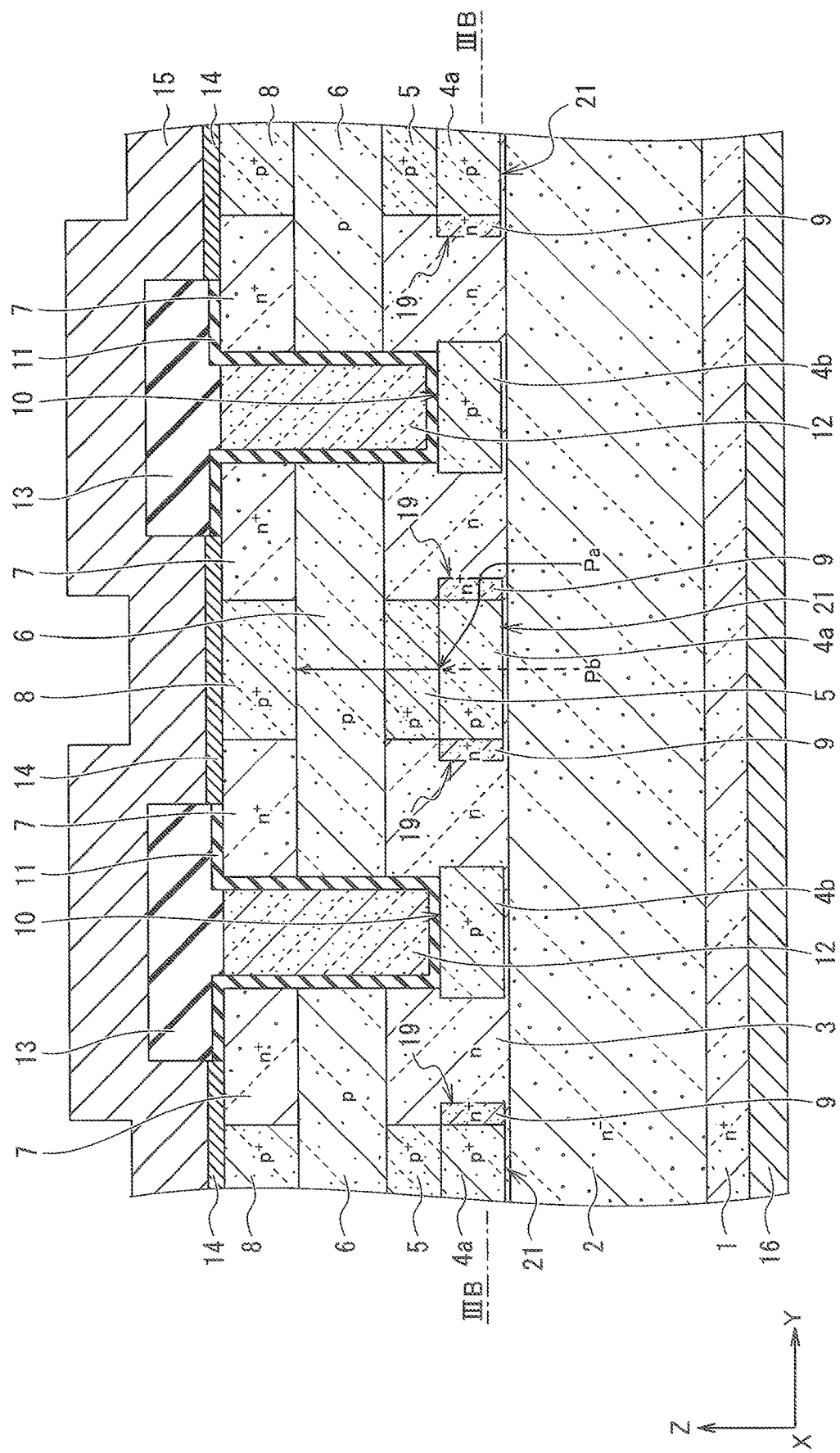

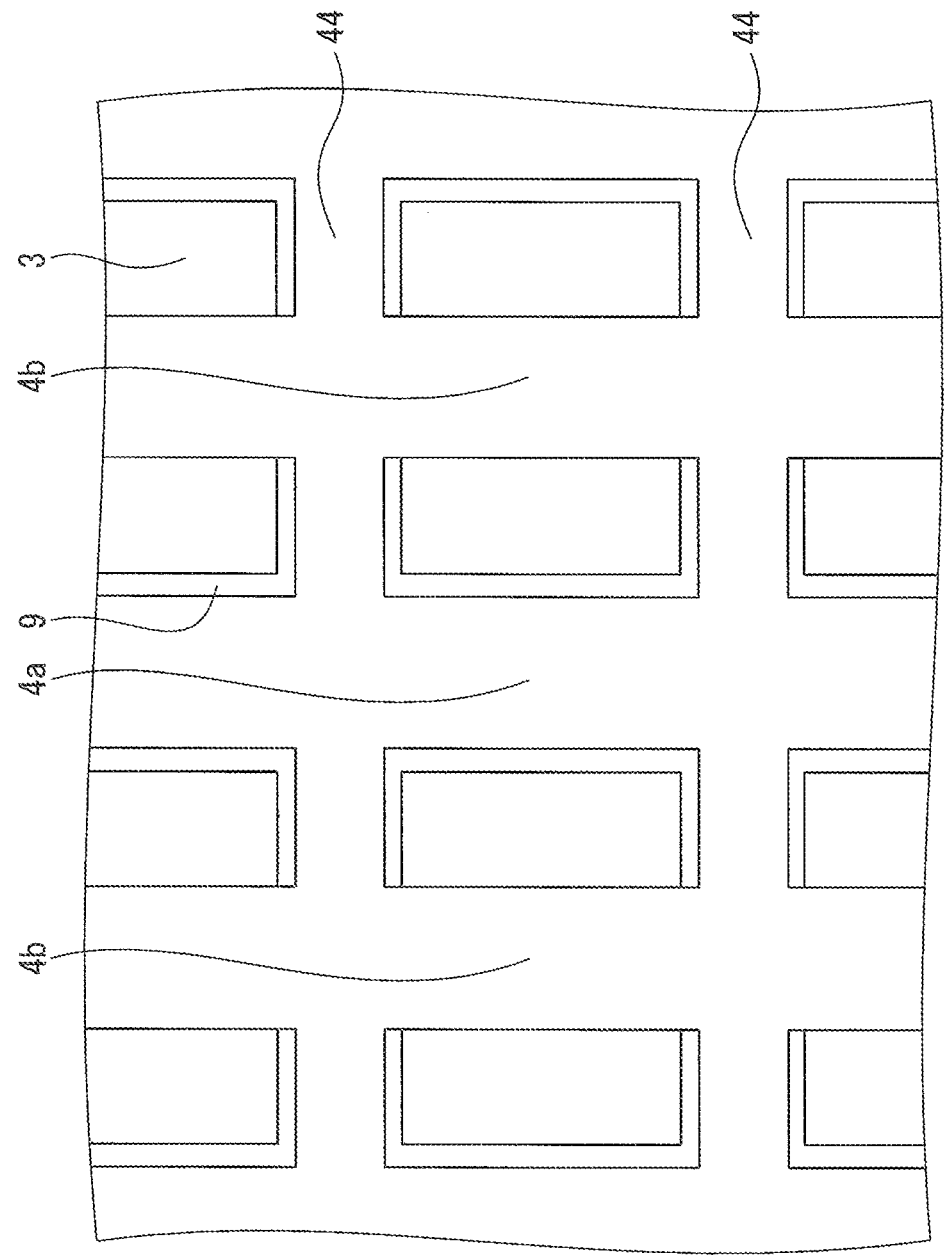

SEMICONDUCTOR DEVICE

CROSS REFERENCE TO RELATED APPLICATIONS

This application is based upon and claims the benefit of priority from the prior Japanese Patent Application No. 2021-8857 filed on Jan. 22, 2021, the entire contents of which are incorporated herein by reference.

BACKGROUND OF THE INVENTION

1. Field of the Invention

The present invention relates to a semiconductor device, and more particularly to a highly reliable trench gate semiconductor device.

2. Description of the Related Art

Conventionally, silicon (Si) semiconductors are used in power semiconductor devices mainly used for power conversion devices and the like. In recent years, silicon carbide (SiC), which is a wide-gap semiconductor, is expected as a semiconductor material to replace Si. Compared with a conventional semiconductor device using an Si semiconductor as a material, a semiconductor device using an SiC semiconductor has advantages, such that the resistance of the semiconductor device in the on-state can be reduced to several hundredths and the SiC semiconductor can be used in an environment at higher temperature, for example, 200° C. or higher. Such advantages are given by the properties of the SiC material itself such that the band gap of SiC is about 3 times larger than that of Si and the dielectric breakdown electric field strength is about ten times larger than that of Si.

As power semiconductor devices, Schottky barrier diodes (SBDs), field effect transistors (FETs), static induction transistors (SITs), insulated gate bipolar transistors (IGBTs), and the like have been commercialized. A trench-gate MOSFET is a semiconductor device having a three-dimensional structure in which a trench is formed in a SiC semiconductor substrate and the sidewall of the trench is used as a channel. Therefore, when comparing elements having the same on-resistance, the trench-gate MOSFET can have an overwhelmingly smaller element area than the planar vertical MOSFET, and the trench-gate MOSFET is considered to be a particularly promising structure of a semiconductor element.

In the conventional trench-gate MOSFET, since the channel is formed in the vertical direction along the sidewall of the trench provided in the SiC semiconductor layer, the entire inner wall of the trench is covered with the gate insulating film. Since the dielectric breakdown electric field strength of SiC is about 10 times higher than that of Si, the dielectric breakdown does not occur in the SiC semiconductor layer when a high voltage is applied, and a high electric field is also applied to the gate insulating film provided on the inner wall of the trench. In particular, the electric field tends to concentrate on the bottom of the trench facing the drain electrode, and the dielectric breakdown of the gate insulating film easily occurs. In order to improve the reliability of the trench-gate MOSFET, an electric field relaxation structure for relaxing the electric field crowding at the bottom of the trench to prevent the gate insulating film from the dielectric breakdown is required. As the electric field relaxation structure for relaxing the electric field crowding at the bottom of the trench, a $p^+$-type base-bottom embedded region inside an n-type current spreading layer (CSL) provided around the trench and a $p^+$-type gate-bottom protection region in contact with the bottom of the gate is selectively provided.

However, in the conventional trench-gate MOSFET, the breakdown voltage of each pn junction between the base-bottom embedded region and the current spreading layer, and between the gate-bottom protection region and the current spreading layer is almost the same. Thus, the breakdown voltage of the pn junction in the gate-bottom protection region may be smaller than the pn junction in the base-bottom embedded region in some situations. In such case, the breakdown voltage of the MOSFET is provided by the breakdown voltage at the bottom of the trench. When an avalanche breakdown occurs in the pn junction at the bottom of the trench, carriers are injected into the gate insulating film inside the trench to concentrate the electric field on the bottom of the trench, and dielectric breakdown of the gate insulating film may occur.

JP 6617657 B describes that the n-type embedded layer in contact with the bottom surface of the base-bottom embedded region is provided between the base region and the drift layer by ion implantation to protect the gate insulating film in the bottom of the trench. In cases where the concentration of the n-type impurities in the embedded layer is higher than the concentration of the n-type impurities just below the gate-bottom protection region, the electric field strength applied to the base-bottom embedded region may be higher than that of the gate-bottom protection region. Therefore, the avalanche breakdown is more likely to occur in the base-bottom embedded region rather than in the gate-bottom protection region, and it is possible to prevent the avalanche current from flowing to the gate insulating film.

JP 2019-121716 A describes that the n-type embedded layer is provided in a stripe shape by ion-implantation in the direction perpendicular to the longitudinal direction of the trench at a position deeper than the base-bottom embedded region and the gate-bottom protection region. The embedded layer has a higher impurity concentration than the n-type drift layer and the n-type current spreading layer (CSL) between the base-bottom embedded region and the trench. As a result, due to the current spreading by the embedded layer, the electric field crowding at the bottom of the trench may be relaxed to prevent the avalanche breakdown at the bottom of the trench.

JP 6759563 B describes that the n-type base-bottom covering layer which covers the top surface and side surfaces of the base-bottom embedded region and the n-type gate-bottom covering layer which partially covers the gate-bottom protection region are provided by ion implantation. Each of the base-bottom covering layer and the gate-bottom covering layer has a higher impurity concentration than the current spreading layer to prevent a high electric field from being applied to the gate insulating film at the bottom of the trench.

Hexagonal SiC has anisotropy in the dielectric breakdown electric field, and the dielectric breakdown electric field in the c-axis direction is higher (refer to T. Kimoto and J. A. Cooper, "Fundamentals of Silicon Carbide Technology: Growth, Characterization, Devices, and Applications", Appendix C: Major Physical Properties of Common SiC Polytypes, John Wiley & Sons, September 2014, pp 521-524). In JP 6617657 B, JP 2019-121716 A and JP 6759563 B, a structure for mitigating the electric field strength in the direction parallel to the c-axis is proposed, but the anisotropy of the dielectric breakdown electric field is not considered. The dielectric breakdown electric field is lower in the direction orthogonal to the c-axis, in which the gate-bottom protection region and the base-bottom embedded region face each other. That is, when the electric field is concentrated in the direction orthogonal to the c-axis direction, avalanche breakdown may occur at an electric field strength lower than that in the c-axis direction. Since the current spreading layer between the gate-bottom protection region and the base-bottom embedded region has a uniform impurity concentration, the avalanche breakdown occurs in the gate-bottom protection region, resulting in dielectric breakdown of the gate insulating film.

Further, in JP 6617657 B, JP 2019-121716 A and JP 6759563 B, implantation of n-type impurity ions is required at a position deeper than the bottom surface of the base-bottom embedded region or the gate-bottom protection region. Therefore, the operating time of the ion-implanter in the ion-implantation process may be longer, and the manufacturing capacity may be deteriorated.

SUMMARY OF THE INVENTION

An aspect of the present invention inheres in a semiconductor device, including: (a) a drift layer of a first conductivity type made of a hexagonal semiconductor having a wider bandgap than silicon; (b) a first current spreading layer of the first conductivity type provided on a top surface of the drift layer, having a higher impurity concentration than the drift layer; (c) a base region of a second conductivity type provided on a top surface of the first current spreading layer; (d) a gate-bottom protection region of the second conductivity type provided inside the first current spreading layer, having a side surface and a bottom surface which are in contact with the first current spreading layer; (e) a base-bottom embedded region of the second conductivity type provided in the first current spreading layer, separated from the gate-bottom protection region and in contact with a bottom surface of the base region; (f) a second current spreading layer of the first conductive type having a side surface opposed to the gate-bottom protection region and in contact with a side surface of the base-bottom embedded region; and (g) an insulated-gate electrode structure provided in a trench penetrating the base region to reach the gate-bottom protection region, wherein an impurity concentration ratio of the gate-bottom protection region to the first current spreading layer is greater than an impurity concentration ratio of the base-bottom embedded region to the second current spreading layer.

BRIEF DESCRIPTION OF THE DRAWINGS

FIG. 3A is a schematic cross-sectional view taken along the line IIIA-IIIA in FIG. 2, illustrating an example of the SiC semiconductor device according to the first embodiment;

FIG. 3B is a schematic plan view taken along the line IIIB-IIIB in FIG. 3A;

DETAILED DESCRIPTION

Figure 1:
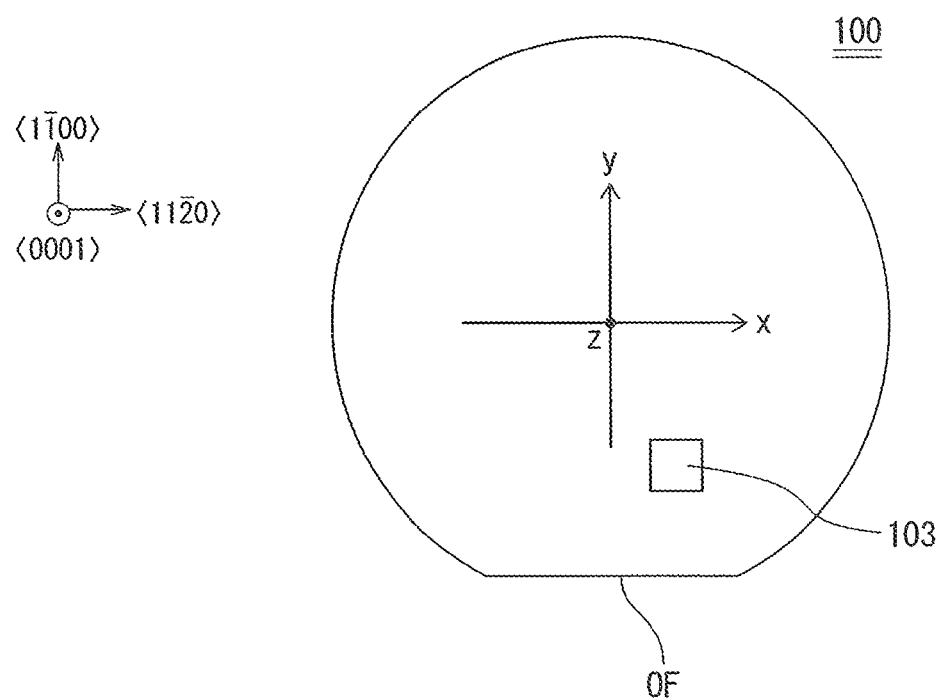
FIG. 1 is a schematic plan view illustrating a semiconductor wafer used for manufacturing a semiconductor device according to a first embodiment.

Hereinafter, first and second embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the present specification, the source region of the MOS transistor is the "one main region (first main region)" that can be selected as the emitter region of the insulated gate bipolar transistor (IGBT). Further, in a thyristor such as a MOS-controlled electrostatic induction thyristor (SI thyristor), one main region can be selected as a cathode region. The drain region of the MOS transistor is the "other main region (second main region)" of the semiconductor device, which can be selected as the collector region in the IGBT and the anode region in the thyristor. As used herein, the term "main area" means either the first main area or the second main area, which is appropriate from the common general technical knowledge of those skilled in the art.

Further, in the following descriptions, the terms relating to directions, such as "top and bottom" are merely defined for illustration purposes, and thus, such definitions do not limit the technical spirit of the present invention. Therefore, for example, when the paper plane is rotated by 90 degrees, the "top and bottom" are read in exchange to the "left and right". When the paper plane is rotated by 180 degrees, the "top" is changed to the "bottom", and the "bottom" is changed to the "top". Further, in the following description, the case where a first conductivity type is n-type and a second conductivity type is p-type will be exemplarily described. However, it is also possible to select the conductivity type in an inverse relationship so that the first conductivity type is p-type and the second conductivity type is n-type. Further, the superscript "+" or "−" added to the mark "n" or "p" denotes that a semiconductor region has relatively higher or lower impurity concentration than a region without the superscript "+" or "−" added. It should be noted that semiconductor regions denoted by the same mark, such as "n", do not necessarily have exactly the same impurity concentration. Further, in the specification, "−" in the Miller index notation denotes a bar on top of the following Miller index, and a negative index is denoted with adding "−" before the index.

First Embodiment

<Structure of Semiconductor Device>

As illustrated in FIG. 1, a semiconductor device according to a first embodiment is manufactured based on a semiconductor substrate 100 having a crystal orientation (0001), made of a hexagonal semiconductor such as SiC. An orientation flat OF indicating the crystal orientation of the semiconductor substrate 100 is provided on the edge of the semiconductor substrate 100. The semiconductor substrate 100 is sliced along a direction in which the plane is inclined by a certain offset angle, or an off angle, with respect to a specific crystal orientation, and the position of the orientation flat OF is determined by the crystal orientation. Instead of the orientation flat OF, a notch may be provided on the edge of the semiconductor substrate 100. The Z direction orthogonal to the paper surface of FIG. 1 is the <0001> (c-axis) direction, the X direction is the <11-20> direction, and the Y direction is the <1-100> direction. One semiconductor chip 103 is exemplified on the top surface of the semiconductor substrate 100 illustrated in FIG. 1. The semiconductor chip 103 has a rectangular planar shape and is arranged in a matrix shape on the semiconductor substrate 100.

Figure 2:
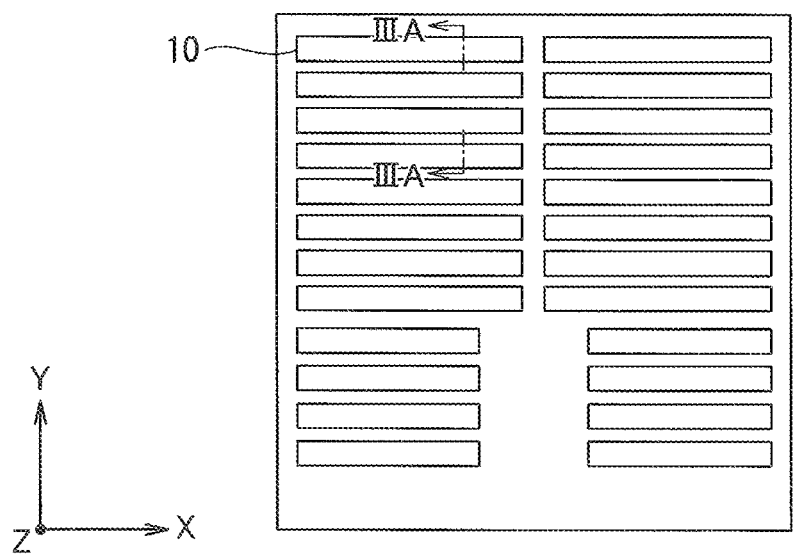
FIG. 2 is a schematic plan view illustrating an arrangement of trenches in the semiconductor device according to the first embodiment.

The semiconductor chip 103 is provided with an active area including an active element and an outer-edge area having an edge-termination structure for breakdown voltage. FIG. 2 illustrates a plurality of trenches 10 of a MOSFET having a trench gate structure provided in the active area. Although not shown, an electric-field relaxation region, such as a guard ring, a junction termination extension (JTE), and a channel stopper or the like may be provided on the outer-edge area. As illustrated in FIG. 2, on the top surface of the semiconductor chip 103, the trenches 10 extend in a stripe shape along the <11-20> direction. The crystal plane of each sidewall of the trenches is (11-20) plane, that is a-plane, or (1-100) plane, that is m-plane.

FIG. 3A is a cross-sectional view of the semiconductor device according to the first embodiment as viewed from the direction of line IIIA-IIIA in FIG. 2. As illustrated in FIG. 3A, in the semiconductor device according to the first embodiment, a top surface of a first conductivity type (n-type) drift layer 2 is a plane orthogonal to the <0001> (c-axis) direction, that is, the Z direction. A second conductivity type (p type) base region 6 is arranged on the top surface of the drift layer 2. Each of the drift layer 2 and the base region 6 is implemented by an epitaxial growth layer (hereinafter, referred to as "epitaxial layer") made of SiC. A $p^+$-type base contact region 8 having a higher impurity concentration than the base region 6 is selectively provided on an upper portion of the base region 6. An $n^+$-type first main region (source region) 7 having a higher impurity concentration than the drift layer 2 is selectively provided on the upper portion of the base region 6 so as to be in contact with the base contact region 8.

For example, the impurity concentration of the drift layer 2 is $2\times10^{15}$ cm$^{-3}$ or more and $2\times10^{16}$ cm$^{-3}$ or less, and the impurity concentration of the base region 6 is $1\times10^{17}$ cm$^{-3}$ or more and $1\times10^{18}$ cm$^{-3}$ or less. The impurity concentration of the base contact region 8 is $5\times10^{18}$ cm$^{-3}$ or more and $5\times10^{20}$ cm$^{-3}$ or less, and the impurity concentration of the source region 7 is $5\times10^{18}$ cm$^{-3}$ or more and $5\times10^{20}$ cm$^{-3}$ or less.

A trench 10 having a width of 1 μm or less is provided so as to penetrate the base region 6 from the top surfaces of the source region 7 and the base region 6. The source region 7 and the base region 6 are in contact with an outer sidewall of the trench 10. A gate insulating film 11 is provided on a bottom surface and a sidewall inside the trench 9. A gate electrode 12 is embedded in the trench 9 via the gate insulating film 11 to form an insulated-gate electrode-structure (11, 12). For the gate insulating film 11, in addition to a silicon oxide ($SiO_2$) film, a dielectric film, such as a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film, may be adopted. Moreover, a single-layer film of any one of the above-mentioned dielectric films or a composite film in which the plural dielectric films are laminated, may be used. For a material of the gate electrode 12, for example, a polysilicon layer doped with impurities, such as phosphorus (P), boron (B) and the like, at a high concentration, that is a doped polysilicon layer, may be used.

An n-type first current spreading layer (CSL) 3 having a higher impurity concentration than the drift layer 2 is selectively provided on the drift layer 2. The bottom of the trench 10 reaches the first current spreading layer 3. The first current spreading layer 3 does not necessarily have to be provided. When the first current spreading layer 3 is not provided, the bottom of the trench 10 reaches the drift layer 2. A $p^+$-type gate-bottom protection region 4b is provided inside the first current spreading layer 3 so as to be in contact with the bottom of the trench 10. Inside the first current spreading layer 3, a $p^+$-type first embedded region 4a is provided below the base contact region 8 at the same depth level as the gate-bottom protection region 4b so as to be separated from the gate-bottom protection region 4b. A $p^+$-type second embedded region 5 is provided on an upper portion of the first current spreading layer 3 so as to be in contact with a top surface of the first embedded region 4a and a bottom surface of the base region 6. The first embedded region 4a and the second embedded region 5 implement a base-bottom embedded region (4a, 5). The second embedded region 5 is also provided below the base contact region 8.

As illustrated in FIG. 3A, an $n^+$-type second current spreading layer 9 having a higher impurity concentration than the first current spreading layer 3 is provided so as to be in contact with a side surface of the first embedded region 4a of the base-bottom embedded region (4a, 5). The second current spreading layer 9 has a side surface 19 facing the gate-bottom protection region 4b. Therefore, the direction perpendicular to the side surface 19 of the second current spreading layer 9 is the Y direction, that is, the direction orthogonal to the c-axis. Thus, by selectively increasing the impurity concentration of the n-type region in the p-n junction provided in the direction orthogonal to the c-axis, avalanche breakdown can be generated at a low electric field strength. As a result, since a position where the avalanche breakdown occurs can be limited to the side surface of the first embedded region 4a, it is possible to prevent the dielectric breakdown of the gate insulating film at the bottom of the trench 10. In such case, the second current spreading layer 9 may be provided so as to be in contact with a corner portion of the bottom of the first embedded region 4a in the base-bottom embedded region (4a, 5).

FIG. 3B is a plan view of the semiconductor device according to the first embodiment as viewed from the direction of line IIIB-IIIB in FIG. 3A. In the plan view taken along the line IIIB-IIIB in FIG. 3B, the first embedded region 4a, or the base-bottom embedded region (4a, 5), and the gate-bottom protection region 4b are arranged in parallel in a stripe shape, and the second current spreading layer 9 is selectively provided on the sidewall of the first embedded region 4a. Here, a $p^+$-type connecting portion 44, which connects the first embedded region 4a and the gate-bottom protection region 4b, may be provided. Since the gate-bottom protective region 4b is electrically connected to a source electrode 15 via the base-bottom embedded region (4a, 5) by the connecting portion 44, the gate insulating film 11 at the bottom of the trench 10 can be reliably protected. In such case, the second current spreading layer 9 may be provided on a sidewall of the connecting portion 44. Thus, the effectiveness of preventing the dielectric breakdown of the gate insulating film 11 at the bottom of the trench 10 may be increased. In addition, the connecting portion 44 may be formed at the depth of the second embedded region 5 to connect a bottom portion of the connecting portion 44 and an upper portion of the gate-bottom protection region 4b. In such case, the second current spreading layer 9 may have a stripe shape along the first embedded region 4a. Also, the connecting portion 44 may be provided in both the first embedded region 4a and the second embedded region 5. Further, the second current spreading layer 9 may be provided on a sidewall of the second embedded region 5.

An interlayer insulating film 13 is arranged on a top surface of the gate electrode 12. For the interlayer insulating film 13, a silicon oxide film which includes additives of both boron (B) and phosphorus (P), that is BPSG, may be used. However, a silicon oxide film which includes the additive of phosphorus (P), that is PSG, a non-doped $SiO_2$ film called "NSG" that does not include any additives of phosphorus (P) and boron (B), a silicon oxide film which includes the additive of both boron (B), that is BSG, an $Si_3N_4$ film and the like, may be used for the interlayer insulating film 13. Alternatively, a composite film in which the above-mentioned films are laminated may be adopted.

A source contact layer 14 is provided so as to physically contact the source region 7 and the base contact region 8 which are exposed in the interlayer insulating films 13. The first main electrode (source electrode) 15 is provided so as to cover the interlayer insulating film 13 and the source contact layer 14. The first main electrode (source electrode) 15 is electrically connected to the source region 7 and the base contact region 8 via the source contact layer 14. For example, a nickel silicide ($NiSi_x$) film may be used for the source contact layer 14, and an aluminum (Al) film or an aluminum-silicon (Al—Si) film may be used for the source electrode 15. A barrier metal layer (not illustrated) may be provided between the interlayer insulating film 13 and the source electrode 15 and between the source contact layer 14 and the source electrode 15. For the barrier metal layer, a titanium nitride (TiN) film, a titanium (Ti) film and the like may be used. The source electrode 15 is arranged separately from a gate surface electrode (not illustrated). Although not illustrated, a gate electrode pad (not illustrated) arranged on the top surface of a field insulating film is electrically connected to the gate electrode 12.

An $n^+$-type second main region (drain region) 1 is arranged on a bottom surface of the drift layer 2. A second main electrode (drain electrode) 16 is arranged on a bottom surface of the drain region 1. For the drain electrode 16, for example, a single-layer film made of gold (Au) or a metal film in which Ti, nickel (Ni), and Au are laminated in this order may be used, and further a metal film, such as molybdenum (Mo), tungsten (W) and the like, may be laminated as the lowermost layer of the drain electrode 16. Further, a drain contact layer may be provided between the drain region 1 and the drain electrode 16. For the drain contact layer, for example, a nickel silicide (NiSi$_x$) film may be adopted.

The first current spreading layer 3 has the impurity concentration of $5\times10^{16}$ cm$^{-3}$ or more and $5\times10^{17}$ cm$^{-3}$ or less, and the second current spreading layer 9 has the impurity concentration of $5\times10^{17}$ cm$^{-3}$ or more and $5\times10^{18}$ cm$^{-3}$ or less. The first embedded region 4a of the base-bottom embedded region (4a, 5) and the gate-bottom protection region 4b have the same impurity concentration of $1\times10^{18}$ cm$^{-3}$ or more and $1\times10^{19}$ cm$^{-3}$ or less. The second embedded region 5 has the impurity concentration of $1\times10^{18}$ cm$^{-3}$ or more and $1\times10^{19}$ cm$^{-3}$ or less. The drain region 1 has the impurity concentration of $1\times10^{18}$ cm$^{-3}$ or more and $1\times10^{19}$ cm$^{-3}$ or less.

In the semiconductor device according to the first embodiment, a structure having the drain region 1 implemented by the semiconductor substrate made of SiC, that is the SiC substrate, and the drift layer 2 implemented by the epitaxial layer made of SiC, that is the SiC layer, is exemplified. The semiconductor regions implementing the semiconductor device according to the first embodiment which include the drain region 1 and the drift layer 2 is not limited to SiC. In addition to SiC, a hexagonal semiconductor material having the forbidden bandgap wider than 1.1 eV of Si, such as gallium nitride (GaN), lonsdaleite (hexagonal diamond), aluminum nitride (AlN) and the like, may be used. As for values of the forbidden bandgaps at room temperature, 3.26 eV for 4H-SiC, 3.02 eV for 6H-SiC, 3.4 eV for GaN, 5.5 eV for diamond and 6.2 eV for AlN, are reported respectively. In the present invention, a semiconductor having a forbidden bandgap larger than that of silicon may be defined as a wide bandgap semiconductor.

During operation of the semiconductor device according to the first embodiment, a positive voltage is applied to the drain electrode 16 with the source electrode 15 as the ground potential and a positive voltage equal to or higher than the threshold value is applied to the gate electrode 12. Thus, an inversion layer, that is a channel, is induced in the base region 6 nearby the side surface of the trench 10 to turn on the semiconductor device. The inversion layer is formed on a region of the base region 6 exposed to the side surface of the trench 10, which is an interface between the gate insulating film 11 and the base region 6 at a position where the base region 6 faces the gate electrode 12. In the on-state, a current flows from the drain electrode 16 to the source electrode 15 via the drain region 1, the drift layer 2, the first current spreading layer 3, the inversion layer in the base region 6, and the source region 7. On the other hand, when the voltage applied to the gate electrode 12 is less than the threshold value, the inversion layer is not induced on the base region 6. Thus, the semiconductor device is turned off and no current flows from the drain electrode 16 to the source electrode 15.

In the first embodiment, as illustrated in FIG. 3, the second current spreading layer 9 is provided to be in contact with the side surface of the first embedded region 4a of the base-bottom embedded region (4a, 5) facing the gate-bottom protection region 4b. The second current spreading layer 9 has the higher impurity concentration than the first current spreading layer 3. An impurity concentration ratio of the gate-bottom protection region 4b to the first current spreading layer 3 is larger than an impurity concentration ratio of the first embedded region 4a to the second current spreading layer 9. Therefore, the electric field intensity may be higher on a side surface 19 of the second current spreading layer 9 in contact with a side surface of the first embedded region 4a than on a side surface of the gate-bottom protection region 4b facing the side surface 19 in the Y direction. Thus, avalanche breakdown may easily occur by the side surface 19 of the second current spreading layer 9. The impurity concentration in each region used here is a net amount of impurity concentration taking into account both p-type impurities and n-type impurities.

Further, as described in T. Kimoto and J. A. Cooper ("Fundamentals of Silicon Carbide Technology: Growth, Characterization, Devices, and Applications", Appendix C: Major Physical Properties of Common SiC Polytypes, John Wiley & Sons, September 2014, pp 521-524), the dielectric breakdown electric field in hexagonal 4H-SiC is 2.2 MVcm$^{-1}$ in the direction orthogonal to the c-axis and 2.8 MVcm$^{-1}$ in the direction parallel to the c-axis. In FIG. 3A, the Y direction is the direction orthogonal to the c-axis, and the Z direction is the direction parallel to the c-axis. The electric field intensity on the side surface 19 of the second current spreading layer 9 having a higher impurity concentration than the first current spreading layer 3 is higher compared to a bottom surface 21 of the first embedded region 4a in contact with the first current spreading layer 3. Further, the dielectric breakdown electric field strength is lower on the side surface 19 of the second current spreading layer 9 having a plane orientation orthogonal to the c-axis than on the bottom surface 21 of the first embedded region 4a having a plane orientation parallel to the c-axis. Therefore, the avalanche breakdown is likely to occur by the side surface 19 of the second current spreading layer 9 having the lower dielectric breakdown electric field. When the avalanche breakdown occurs, the avalanche current may flow not into a path Pb passing the bottom surface 21 of the first embedded region 4a illustrated by the dotted line in FIG. 3A, but into a path Pa passing the inside of the first embedded region 4a via the side surface 19 of the second current diffusion layer 9 illustrated by the solid line in FIG. 3A. As described above, in the semiconductor device according to the first embodiment, the avalanche breakdown occurs by the side surface 19 of the second current spreading layer 9 having the lower dielectric breakdown electric field, and the avalanche current flows to avoid the gate-bottom protection region 4b. Therefore, it is possible to prevent dielectric breakdown of the gate insulating film 11.

As will be described later, the second current spreading layer 9 is formed on the side surface of the first embedded region 4a by selectively implanting n-type impurity ions with multiple-energy from the top surface of the n-ion implanted layer which is a lower layer of the first current diffusion layer 3. In the conventional electric field relaxation structure formed in contact with the bottom surface of the base-bottom embedded region, it is necessary to implant n-type impurity ions deeply beyond the bottom surface of the base-bottom embedded region. On the other hand, in the first embodiment, the second current spreading layer 9 may be formed by the multiple-energy ion implantation at a depth up to the bottom surface of the first embedded region 4a. Therefore, the operating time of the ion-implanter in the process of forming the second current spreading layer can be shortened, and the production capacity can be improved.

<Manufacturing Method of Semiconductor Device>

Next, a manufacturing method of the SiC semiconductor device according to the first embodiment will be given by taking a trench gate MOSFET as an example, with reference to the cross-sectional views of FIGS. 4 to 15. Note that the manufacturing method of the trench gate MOSFET described below is merely an example and may be achieved by various other manufacturing methods including a modification as long as the gist described in the claims is included.

Figure 4:
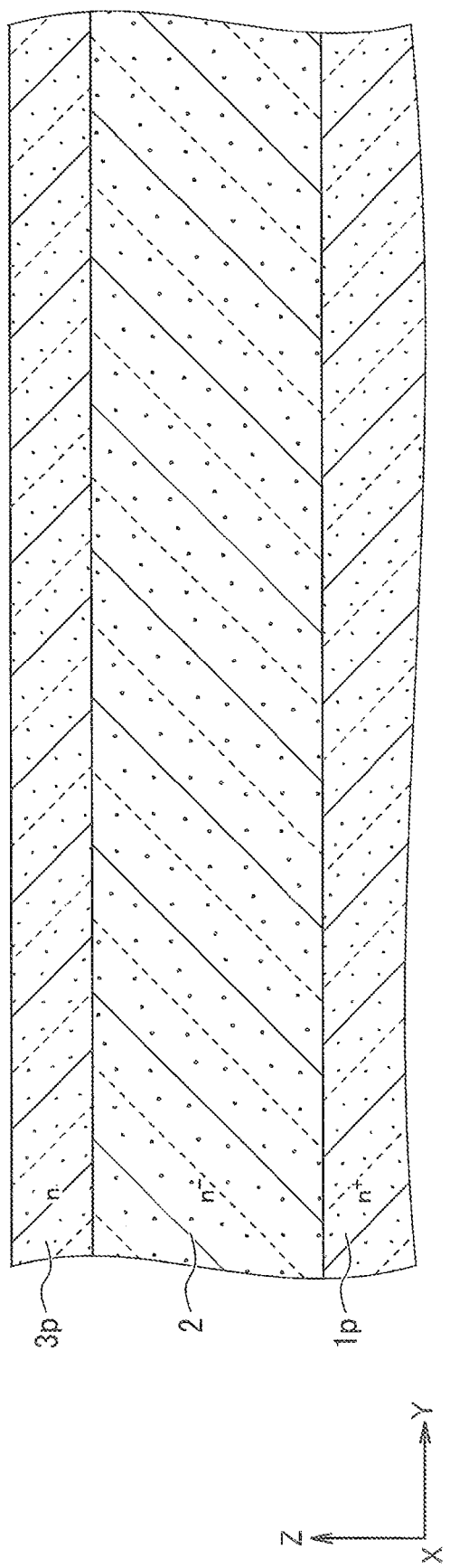
FIG. 4 is a schematic cross-sectional view illustrating an example of a process in a manufacturing method of the semiconductor device according to the first embodiment.

First, an n$^+$-type SiC semiconductor substrate (substrate) 1p in which n-type impurities such as nitrogen (N) are doped, is prepared. A top surface of the substrate 1p is a (0001) plane. As illustrated in FIG. 4, the n-type drift layer 2 is epitaxially grown on the top surface of the substrate 1p. Then, a photoresist film is applied to a top surface of the drift layer 2, and a mask pattern is delineated to the photoresist film by photolithography technique and the like. Using the delineated photoresist film as an ion-implantation mask, n-type impurity ions, such as nitrogen (N) and the like, are selectively implanted into the drift layer 2 from the upper side of the drift layer 2. Thus, an n-type n-ion implanted layer 3p is formed on an upper portion of the drift layer 2.

Figure 5:
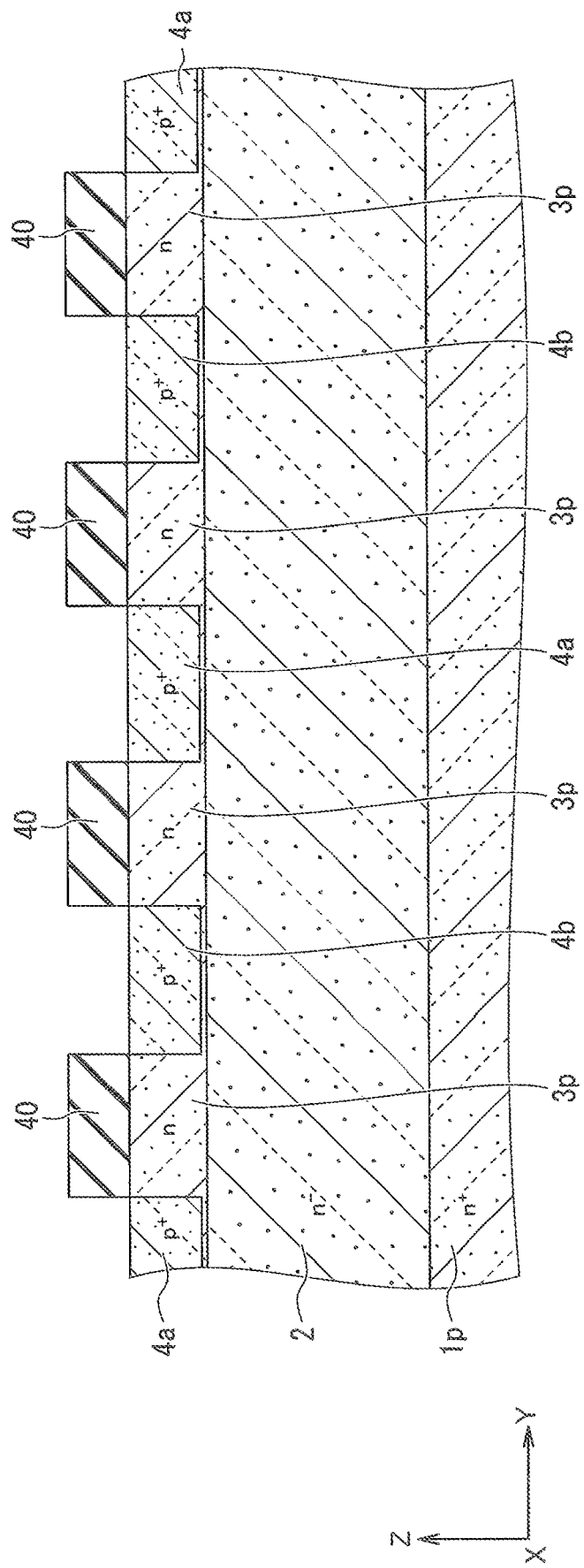
FIG. 5 is a schematic cross-sectional view illustrating an example of a process following FIG. 4 in the manufacturing method of the semiconductor device according to the first embodiment.

An oxide film made of SiO$_2$ is deposited on a top surface of the n-ion implanted layer 3p by CVD technique and the like. A photoresist film is applied to a top surface of the oxide film, and a mask pattern is delineated to the oxide film by photolithography technique, dry etching technique and the like. Using the delineated oxide film 40 as an ion-implantation mask, p-type impurity ions, such as aluminum (Al) and the like, are implanted into the n-ion implanted layer 3p by multiple-energy ion implantation. As a result, as illustrated in FIG. 5, the p$^+$-type first embedded region 4a and the p$^+$-type gate-bottom protection region 4b are selectively formed on an upper portion of the n-ion implanted layer 3p. Here, when the impurity concentrations of the first embedded region 4a and the gate-bottom protection region 4b have to be different from each other, ion implantation may be executed separately for each of the first embedded region 4a and the gate-bottom protection region 4b.

Figure 6:
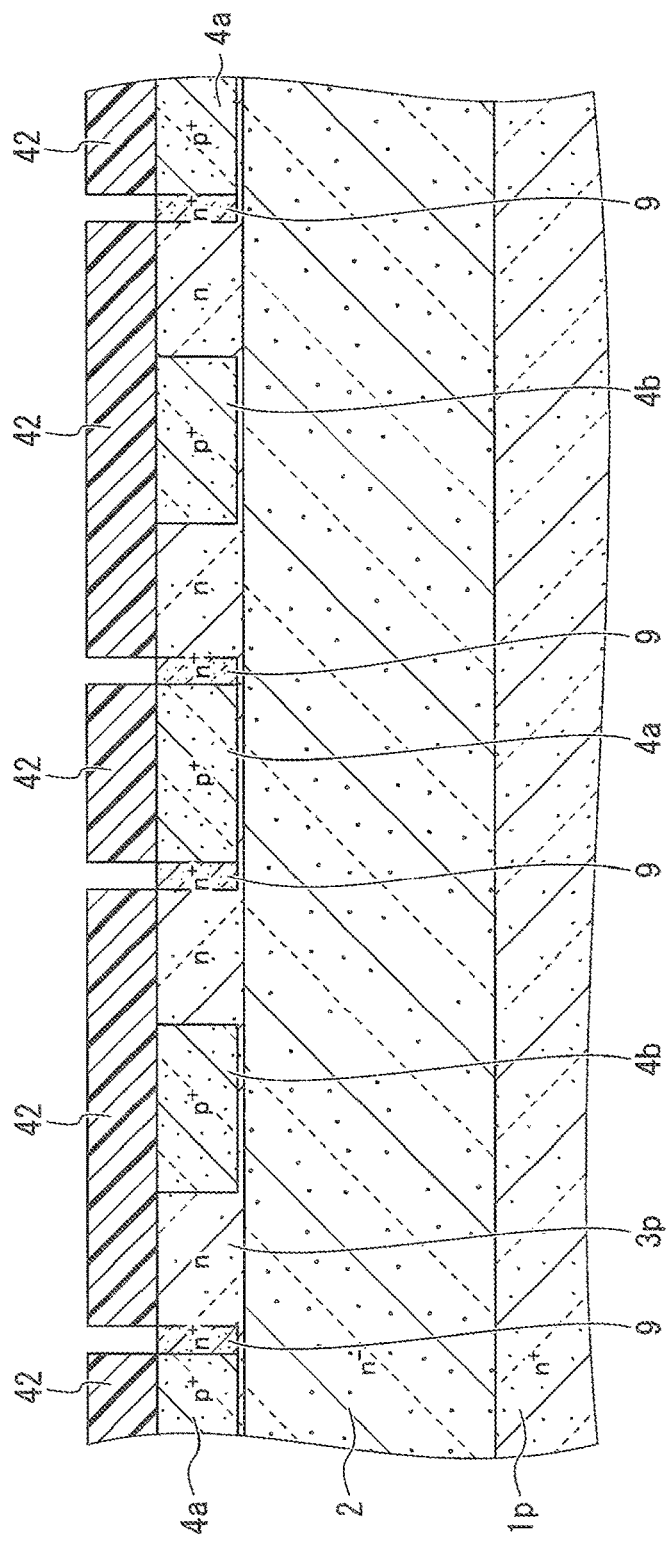
FIG. 6 is a schematic cross-sectional view illustrating an example of a process following FIG. 5 in the manufacturing method of the semiconductor device according to the first embodiment.

After removing the oxide film 40, a photoresist film is applied to the top surfaces of the n-ion implanted layer 3p, the first embedded region 4a and the gate-bottom protection region 4b, and a mask pattern is delineated to the photoresist film by photolithography technique and the like. Using the delineated photoresist film 42 as an ion-implantation mask, n-type impurity ions, such as nitrogen (N) and the like, are selectively implanted into the n-ion implanted layer 3p so as to be in contact with the first embedded region 4a. As a result, as illustrated in FIG. 6, the n$^+$-type second current spreading layer 9 having a higher impurity concentration than the n-ion implanted layer 3p is selectively formed on the side surface perpendicular to the Y direction of the first embedded region 4a. The second current spreading layer 9 is formed so as to extend from top to bottom on the side surface of the first embedded region 4a.

Figure 7:
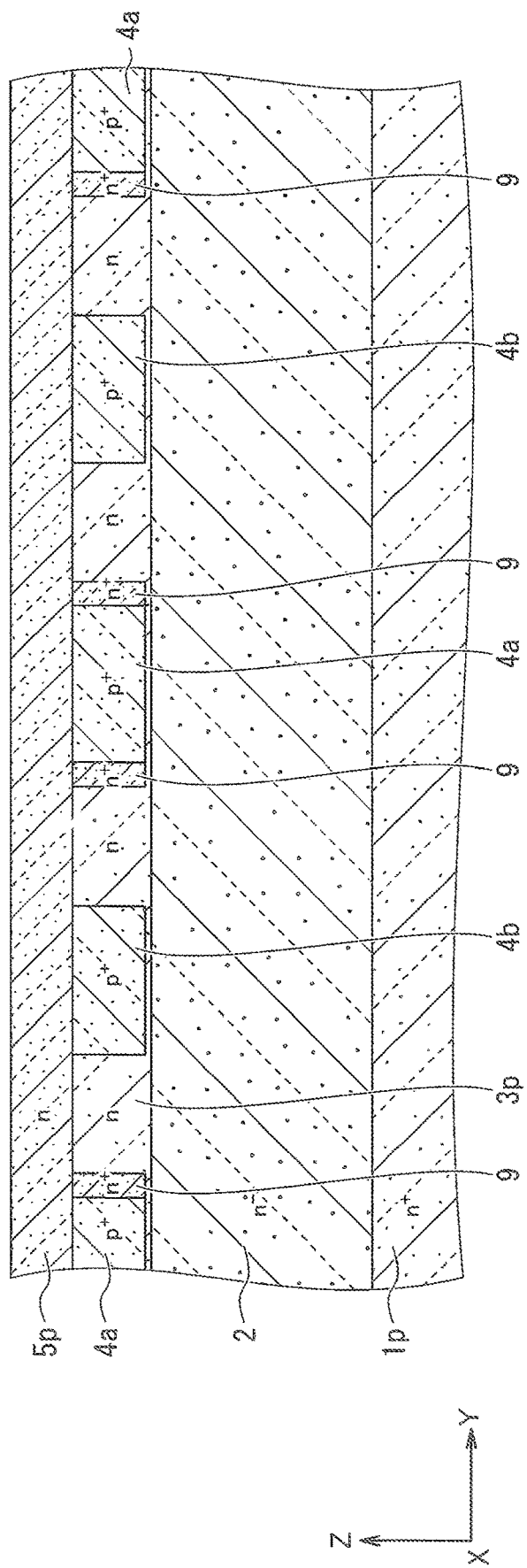
FIG. 7 is a schematic cross-sectional view illustrating an example of a process following FIG. 6 in the manufacturing method of the semiconductor device according to the first embodiment.

After removing the photoresist film 42, an n-type epitaxial layer is grown on the top surfaces of the n-ion implanted layer 3p, the second current spreading layer 9, the first embedding region 4a and the gate-bottom protection region 4b. A photoresist film is applied to a top surface of the epitaxial layer, and a mask pattern is delineated to the photoresist film by photolithography technique and the like. Using the delineated photoresist film as an ion-implantation mask, n-type impurity ions, such as nitrogen (N) and the like, are selectively implanted into an upper portion of the epitaxial layer from an upper side of the epitaxial layer. As a result, as illustrated in FIG. 7, an n-ion implanted layer 5p is formed on the n-ion implanted layer 3p, the second current spreading layer 9, the first embedded region 4a and the gate-bottom protection region 4b. As will be described later, the n-ion implanted layer 3p and the n-ion implanted layer 5p implement the first current spreading layer 3, and the impurity concentration of the n-ion implanted layer 5p is preferably higher than that of the n-ion implanted layer 3p.

Figure 8:
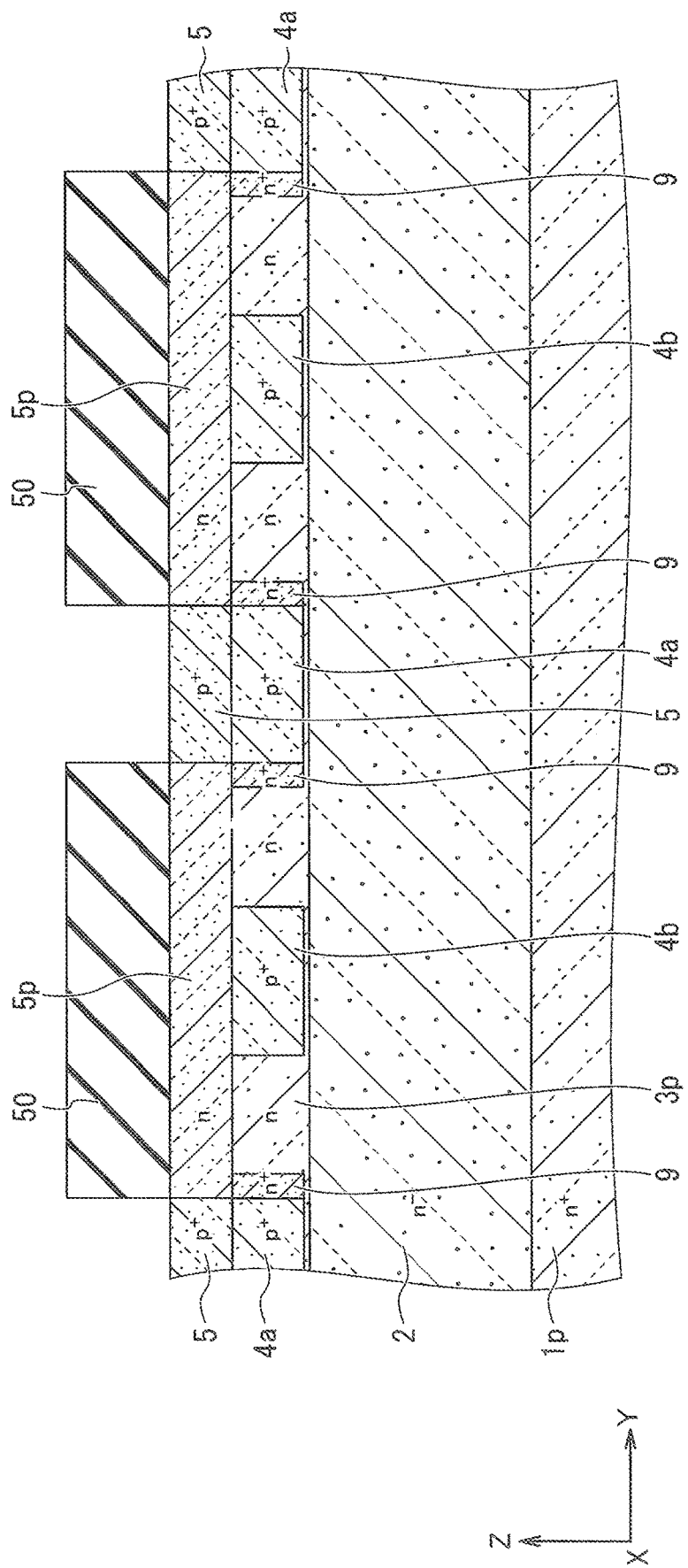
FIG. 8 is a schematic cross-sectional view illustrating an example of a process following FIG. 7 in the manufacturing method of the semiconductor device according to the first embodiment.

Thereafter, an oxide film made of SiO$_2$ is deposited on a top surface of the n-ion implanted layer 5p by CVD technique and the like. A photoresist film is applied to a top surface of the oxide film, and a mask pattern is delineated to the oxide film by photolithography technique, dry etching technique and the like. Using the delineated oxide film 50 as an ion-implantation mask, p-type impurity ions, such as aluminum (Al) and the like, are selectively implanted into the n-ion implanted layer 5p by multiple-energy ion implantation. As a result, as illustrated in FIG. 8, the p$^+$-type second embedded region 5 is selectively formed on the first embedded region 4a. Then, the base-bottom embedded region (4a, 5) implemented by the first embedded region 4a and the second embedded region 5, is formed.

Figure 9:
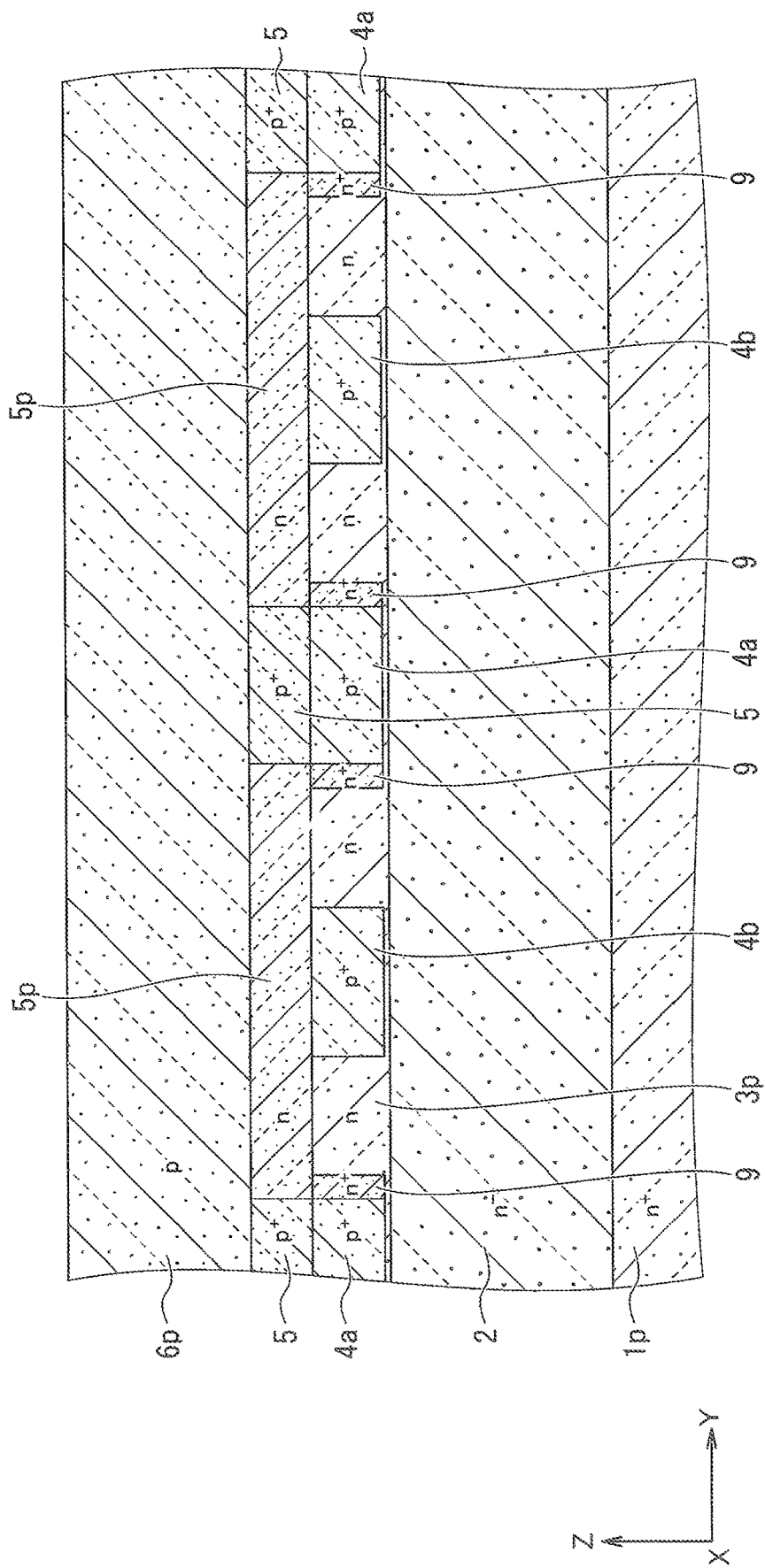
FIG. 9 is a schematic cross-sectional view illustrating an example of a process following FIG. 8 in the manufacturing method of the semiconductor device according to the first embodiment.
Figure 10:
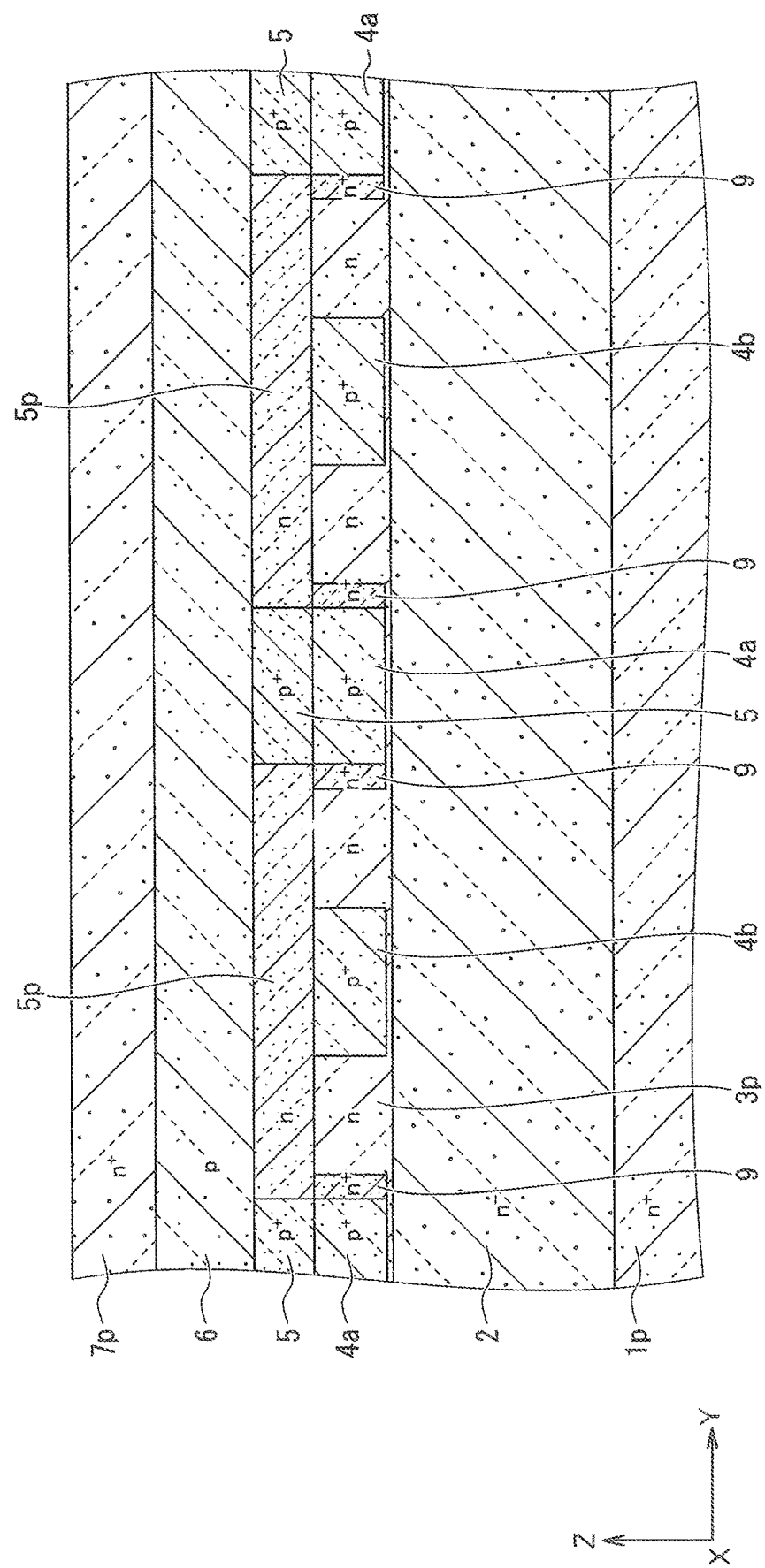
FIG. 10 is a schematic cross-sectional view illustrating an example of a process following FIG. 9 in the manufacturing method of the semiconductor device according to the first embodiment.

After removing the oxide film 50, as illustrated in FIG. 9, a p-type base region 6p is epitaxially grown on the top surfaces of the second embedded region 5 and the n-ion implanted layer 5p. A photoresist film is applied to a top surface of the base region 6p, and a mask pattern is delineated to the photoresist film by photolithography technique and the like. Using the delineated photoresist film as an ion-implantation mask, n-type impurity ions, such as phosphorus (P) and the like, are selectively implanted into the base region 6p from an upper side of the base region 6p. As a result, as illustrated in FIG. 10, an n$^+$-type source region 7p is formed on an upper portion of the base region 6p.

Figure 11:
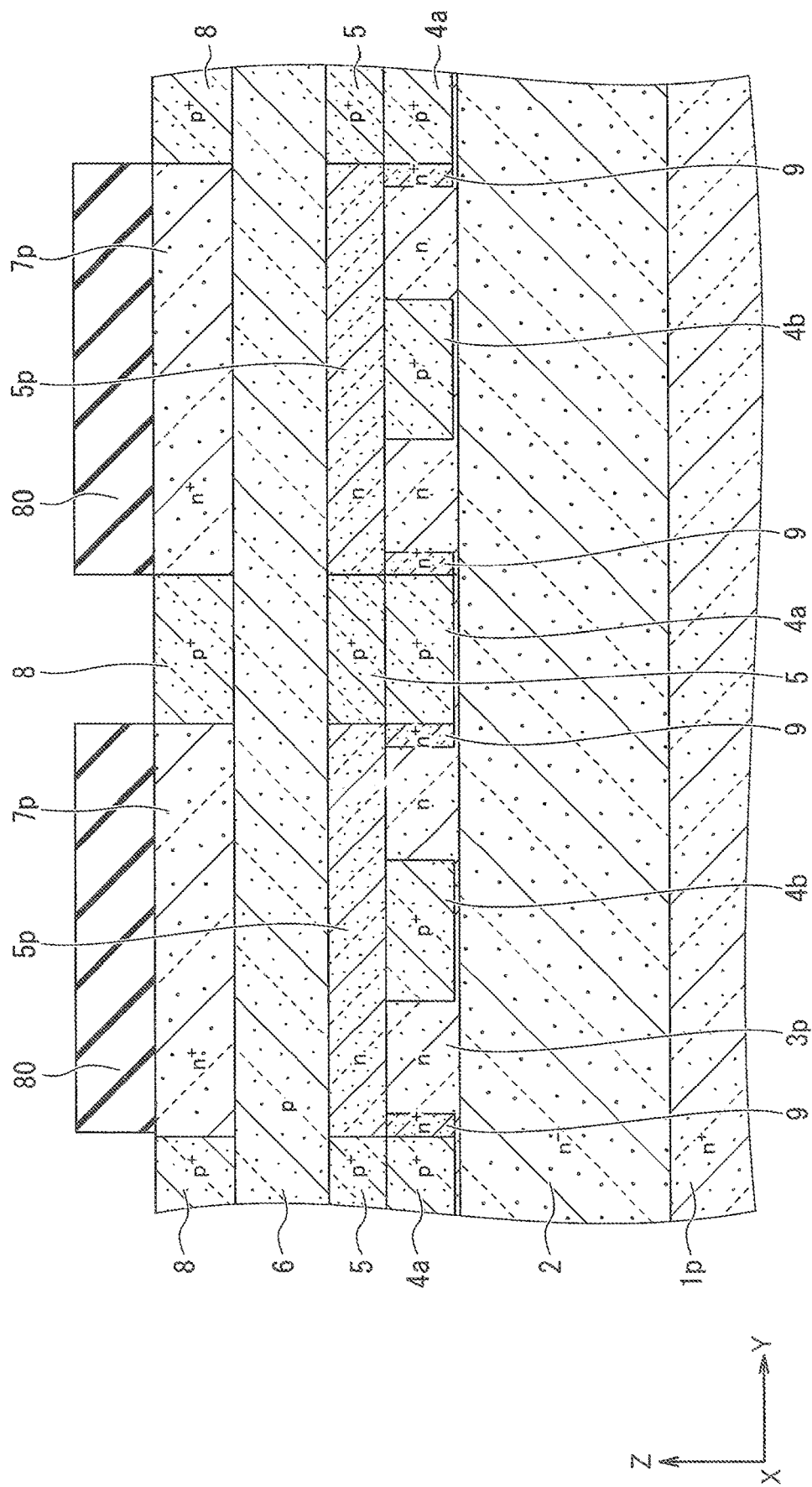
FIG. 11 is a schematic cross-sectional view illustrating an example of a process following FIG. 10 in the manufacturing method of the semiconductor device according to the first embodiment.

After removing the photoresist film used as the ion-implantation mask, an oxide film made of SiO$_2$ is deposited on a top surface of the source region 7p by CVD technique and the like. A photoresist film is applied to a top surface of the oxide film, and a mask pattern is delineated to the oxide film by photolithography technique, dry etching technique and the like. Using the delineated oxide film 80 as an ion-implantation mask, p-type impurity ions, such as aluminum (Al) and the like, are selectively implanted into the source region 7p from an upper side of the source region 7p. As a result, as illustrated in FIG. 11, the p$^+$-type base contact region 8 is formed on the base region 6p above the n-ion implanted layer 5p.

Figure 12:
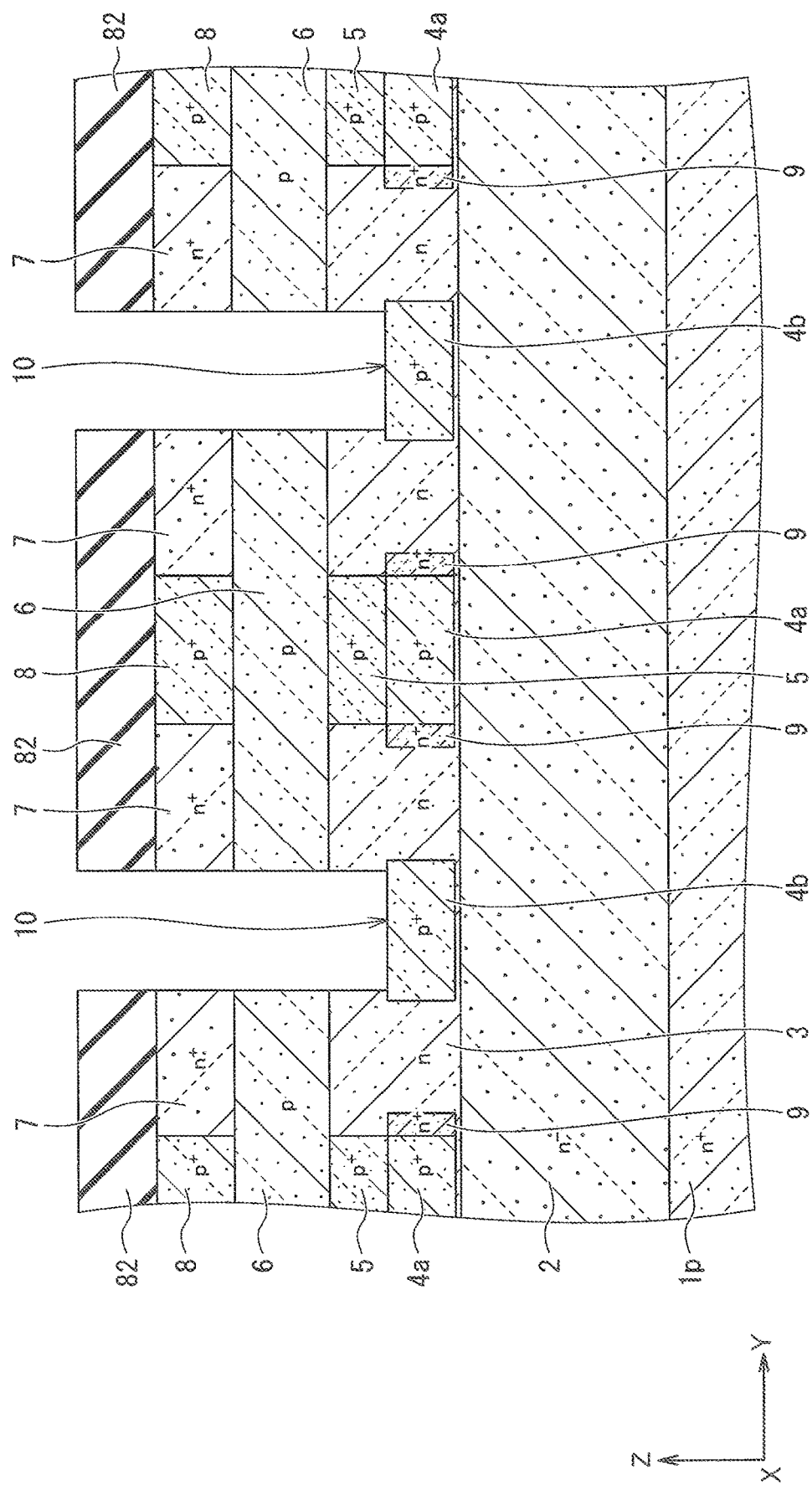
FIG. 12 is a schematic cross-sectional view illustrating an example of a process following FIG. 11 in the manufacturing method of the semiconductor device according to the first embodiment.

After removing the oxide film 80 used as the ion-implantation mask, an oxide film made of SiO$_2$ is deposited on the top surfaces of the base contact region 8 and the source region 7p by CVD technique and the like. A photoresist film is applied to a top surface of the oxide film, and a mask pattern is delineated to the oxide film by photolithography technique, dry etching technique and the like. Using the delineated oxide film 82 as an etching mask, the trench 10 is selectively formed by dry etching technique such as ICP-RIE and the like. As a result, as illustrated in FIG. 12, the trench 10 penetrates the source region 7, the base region 6 and the first current spreading layer 3 to reach the gate-bottom protection region 4b. The n-type first current spreading layer 3 implemented by the n-ion implanted layer 3p and the n-ion implanted layer 5p is formed on the top surface of the drift layer 2.

Figure 13:
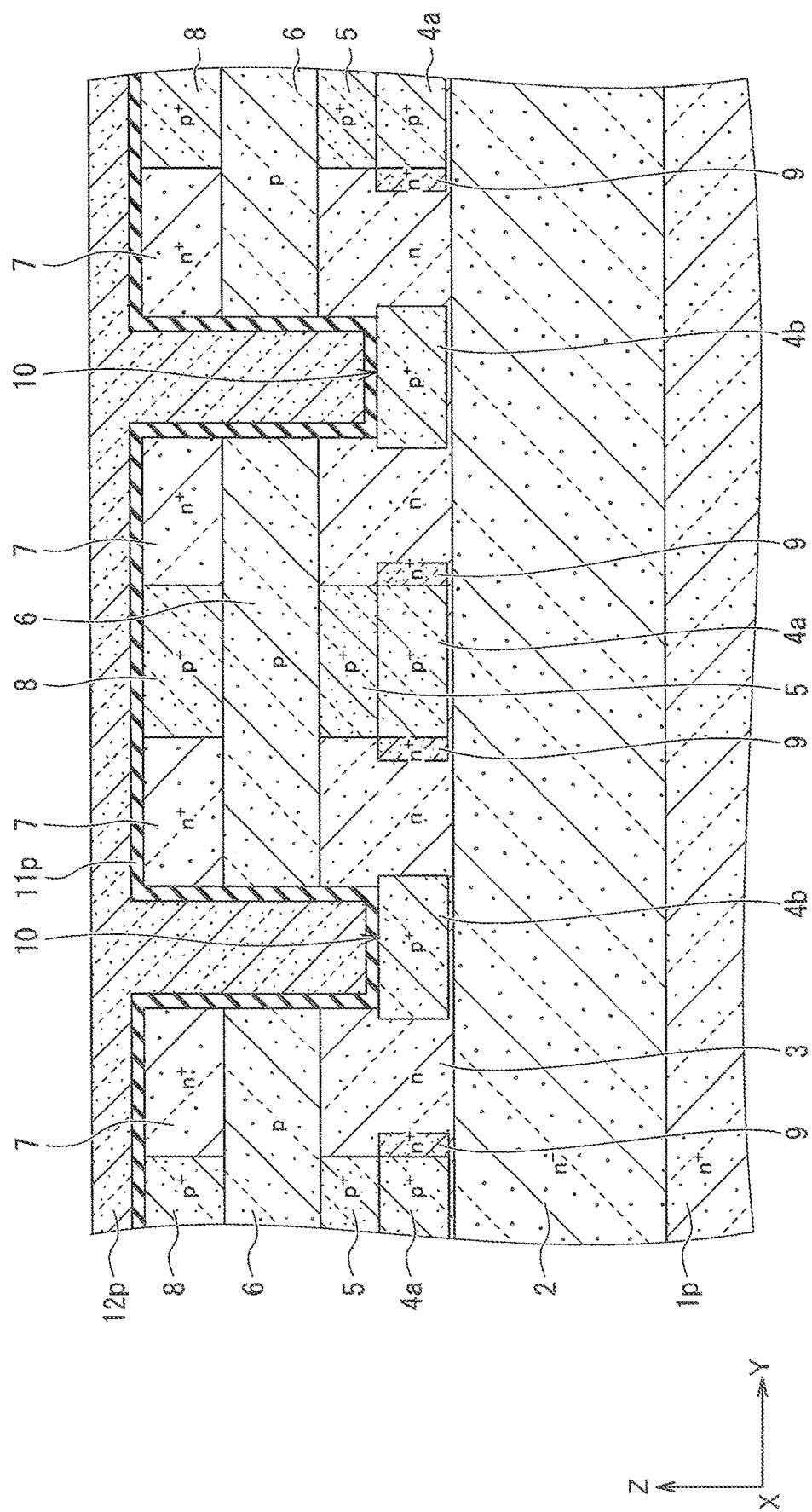
FIG. 13 is a schematic cross-sectional view illustrating an example of a process following FIG. 12 in the manufacturing method of the semiconductor device according to the first embodiment.

After removing the oxide film 82, a carbon (C) film is formed on an inner surface of the trench 10 by carbon sputtering technique and the like. Then, the implanted n-type impurity ions and p-type impurity ions are simultaneously activated by activation annealing. After removing the carbon film, a gate insulating film 11p, such as a SiO$_2$ film and the like, is formed on the bottom surface and sidewall of the trench 10, and on the top surfaces of the source region 7 and the base contact region 8, by thermal oxidation method or chemical vapor deposition (CVD) technique. Then, as illustrated in FIG. 13, a polysilicon layer (a doped polysilicon layer) 12p in which impurities such as phosphorus (P) and boron (B) are doped at a high concentration is deposited so as to fill the trench 10 by CVD technique and the like.

Figure 14:
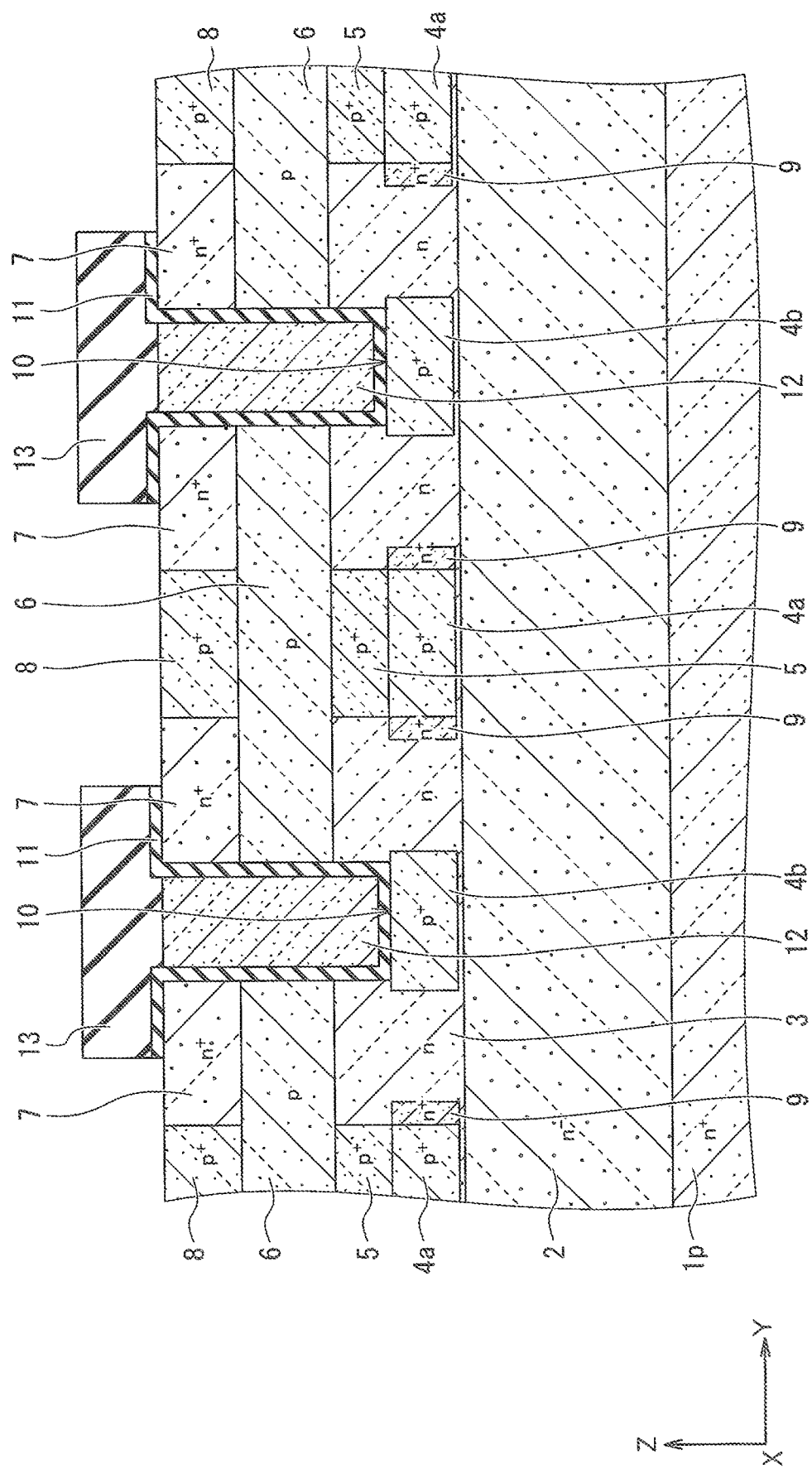
FIG. 14 is a schematic cross-sectional view illustrating an example of a process following FIG. 13 in the manufacturing method of the semiconductor device according to the first embodiment.

Thereafter, a part of the polysilicon layer 12p and a part of the gate insulating film 11p are selectively removed by photolithography technique and dry etching. Thus, as illustrated in FIG. 14, the insulated gate electrode structure (11, 12) is formed by delineating the gate insulating film 11 and the gate electrode 12 of the polysilicon layer. Then, an insulating film is deposited on a top surface of the insulated gate type electrode structure (11, 12) implemented by the gate electrode 12 and the gate insulating film 11 by CVD technique and the like. For the insulating film, boro-phospho silicate glass (BPSG), NSG and the like may be used. Then, a part of the deposited insulating film is selectively removed by photolithography technique, dry etching technique and the like. As a result, as illustrated in FIG. 14, the interlayer insulating film 13 in which a source electrode contact-hole is opened is formed. Although not illustrated, a gate contact-hole is also opened in the interlayer insulating film 13 so as to expose a part of the gate surface electrode connected to the gate electrode 12 at a position different from the source electrode contact-hole.

Figure 15:
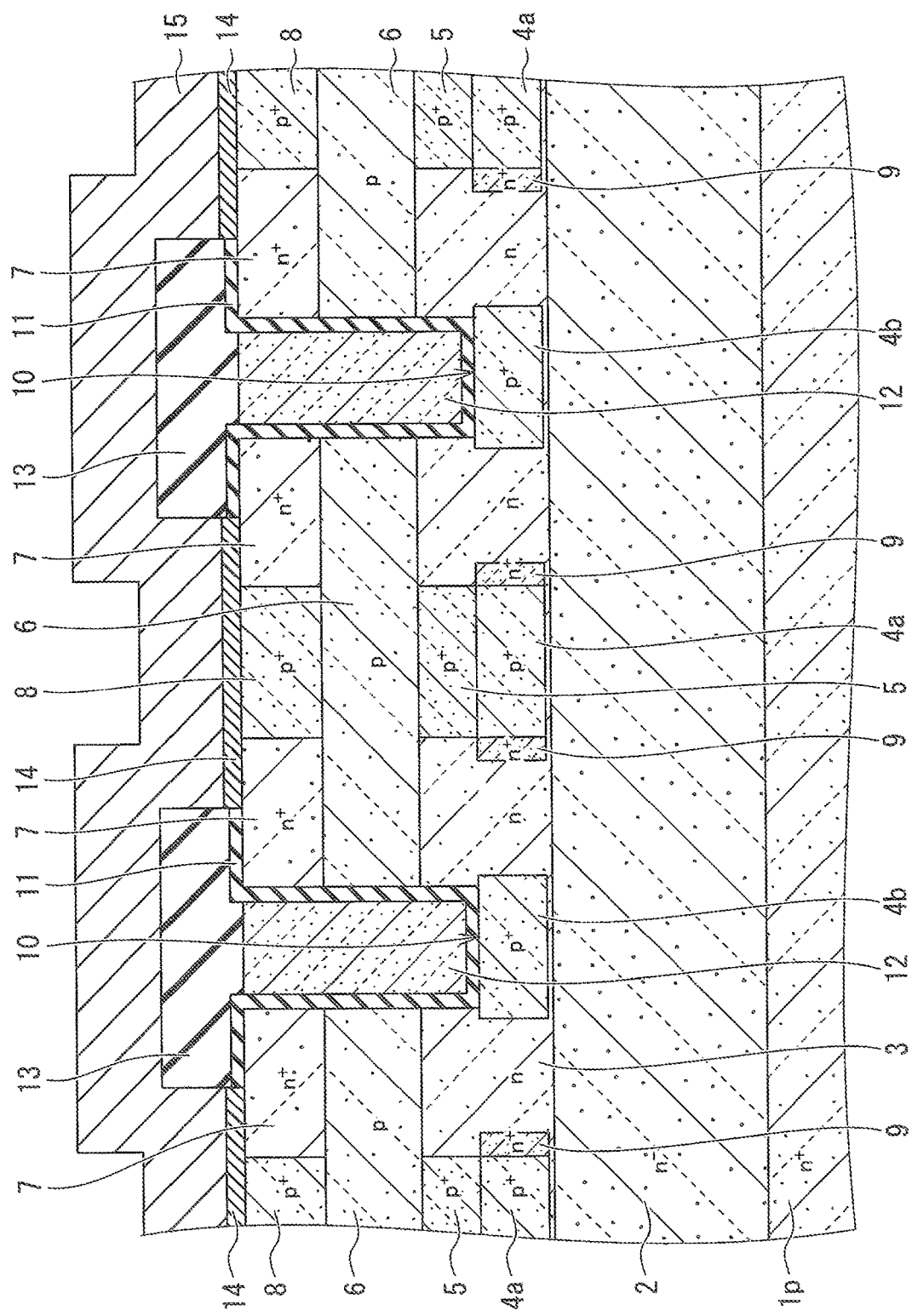
FIG. 15 is a schematic cross-sectional view illustrating an example of a process following FIG. 14 in the manufacturing method of the semiconductor device according to the first embodiment.

A metal layer, such as a Ni film and the like, is deposited by sputtering method, evaporation method and the like, and a pattern is delineated to the metal layer by photolithography technique, RIE technique and the like. Then, a NiSi$_x$ film is formed by rapid thermal annealing (RTA) method, for example, at about 1000° C. Thereafter, the unreacted Ni film is removed to form the source contact layer 14 on the top surfaces of the source region 7 and the base contact region 8 as illustrated in FIG. 15. Then, a barrier metal layer (not shown), such as a Ti film, a TiN film and the like, and a metal layer, such as an Al film and the like, are deposited by sputtering technique and the like, and patterns are delineated to the barrier metal layer and the metal layer by photolithography technique, RIE technique and the like. As a result, a laminated structure of the barrier metal layer and the source electrode 15 is formed so as to cover the source contact layer 14 and the interlayer insulating film 13. Further, the patterns of the source electrode 15 and the gate surface electrode are separated, and the gate surface electrode is electrically connected to the gate electrode 12 via an interconnection layer (not illustrated) provided on the field insulating film (not illustrated).

Further, the bottom surface of the substrate 1p is polished by chemical mechanical polishing (CMP) technique and the like to adjust the thickness to form the drain region 1. Thereafter, the drain electrode 16 made of Ti, Ni, Au and the like is deposited on the entire bottom surface of the drain region 1 by sputtering method, evaporation method and the like. Thus, the trench gate semiconductor device illustrated in FIG. 2 is completed.

In the first embodiment, as illustrated in FIG. 6, the second current diffusion layer 9 is formed on the side surface of the first embedded region 4a by selectively implanting the n-type impurity ions with the multiple-energy from the top surface of the n-ion implanted layer 3p. In the conventional electric field relaxation structure formed in contact with the bottom surface of the base-bottom embedded region, it is necessary to implant n-type impurity ions deeply beyond the bottom surface of the base-bottom embedded region. On the other hand, in the first embodiment, the second current spreading layer 9 may be formed by the multi-energy ion implantation at a depth up to the bottom surface of the first embedding region 4a. Therefore, the operating time of the ion-implanter in the process of forming the second current spreading layer 9 can be shortened, and the production capacity can be improved. As a result, it is possible to reduce the manufacturing cost of the semiconductor device.

As described above, the gate-bottom protection region 4b and the first embedded region 4a of the base-bottom embedded region (4a, 5) have the same impurity concentration, and the second current spreading layer 9 has a higher impurity concentration than the first current spreading layer 3. However, the gate-bottom protection region 4b may have a higher impurity concentration than the first embedding region 4a. In such case, the first current spreading layer 3 and the second current spreading layer 9 may have substantially the same impurity concentration. Alternatively, the second current spreading layer 9 may be omitted and only the first current spreading layer 3 may be provided. The impurity concentration ratio of the gate-bottom protection region 4b to the first current spreading layer 3 can be larger than the impurity concentration ratio of the first embedded region 4a to the second current spreading layer 9 or to the first current spreading layer 3. Therefore, the electric field may be higher by the side surface of the first embedded region 4a than by the side surface of the gate-bottom protection region 4b facing the first embedded region 4a in the Y direction, and avalanche breakdown is likely to occur by the side surface of the first embedded region 4a. Here, "the same impurity concentration" means that the impurity concentration is the same within the range of manufacturing variation, and thus, a difference of about 10% may be included.

Figure 16:
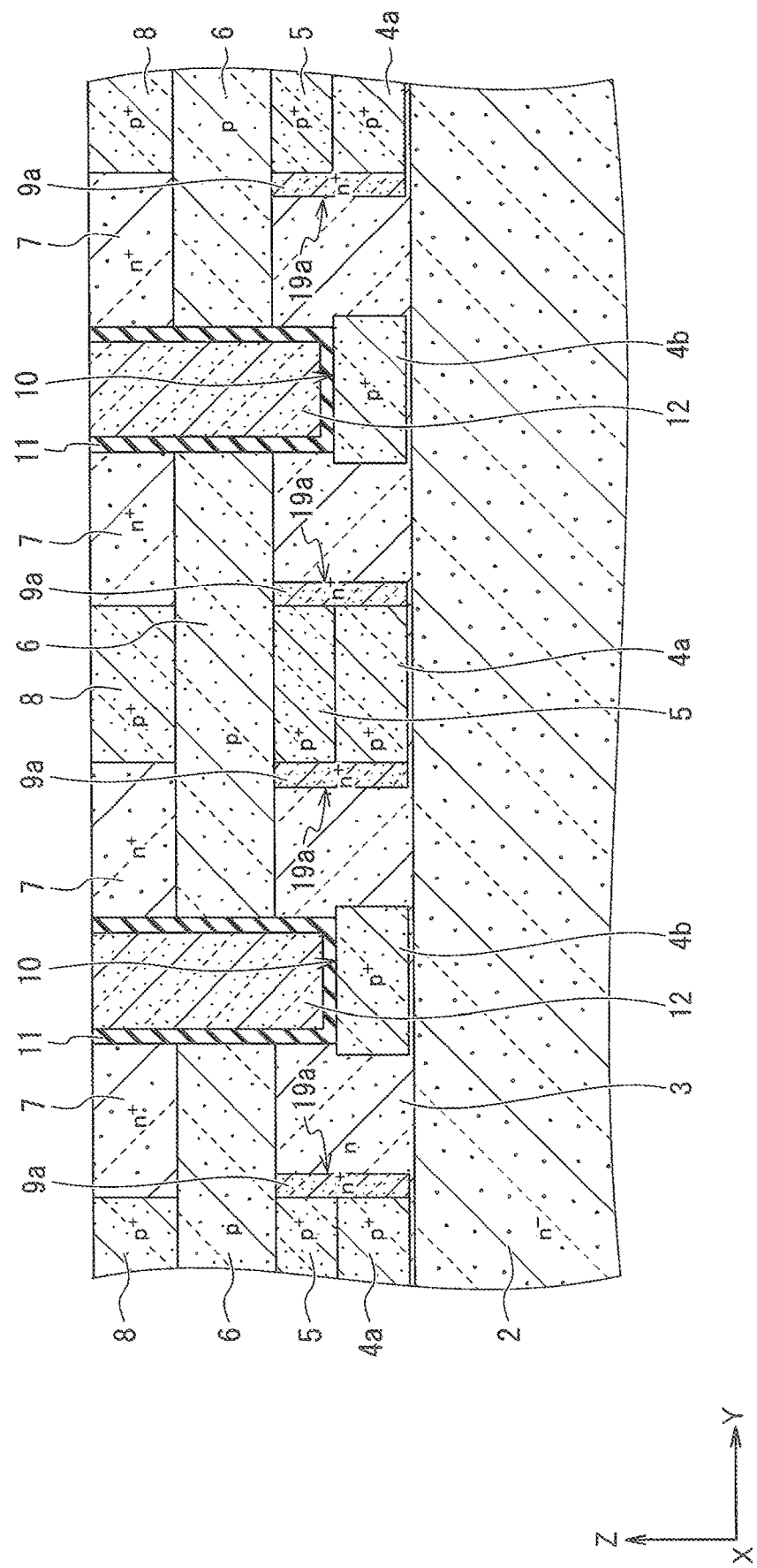
FIG. 16 is a schematic cross-sectional view illustrating another example of the semiconductor device according to the first embodiment.
Figure 17:
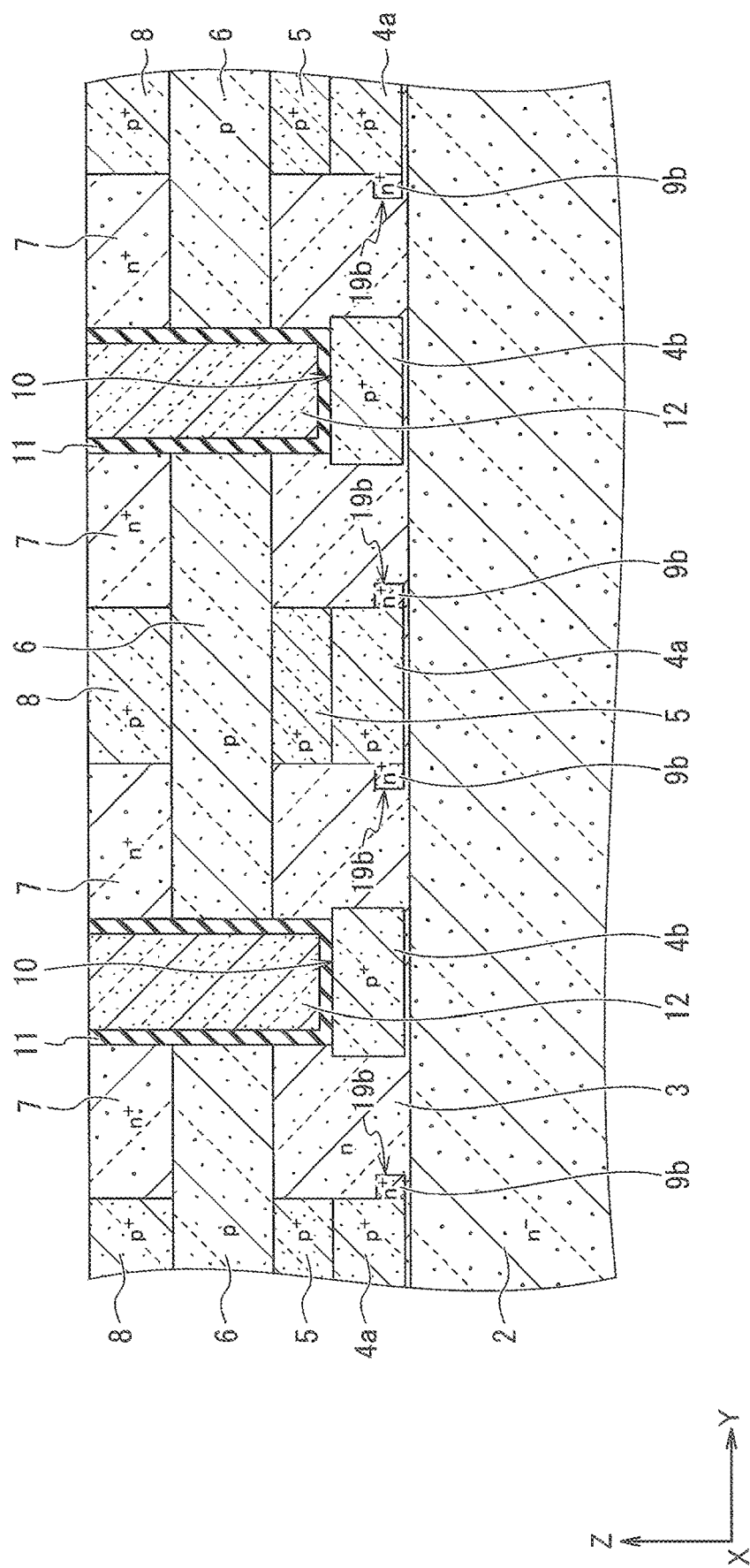
FIG. 17 is a schematic cross-sectional view illustrating another example of the semiconductor device according to the first embodiment.
Figure 18:
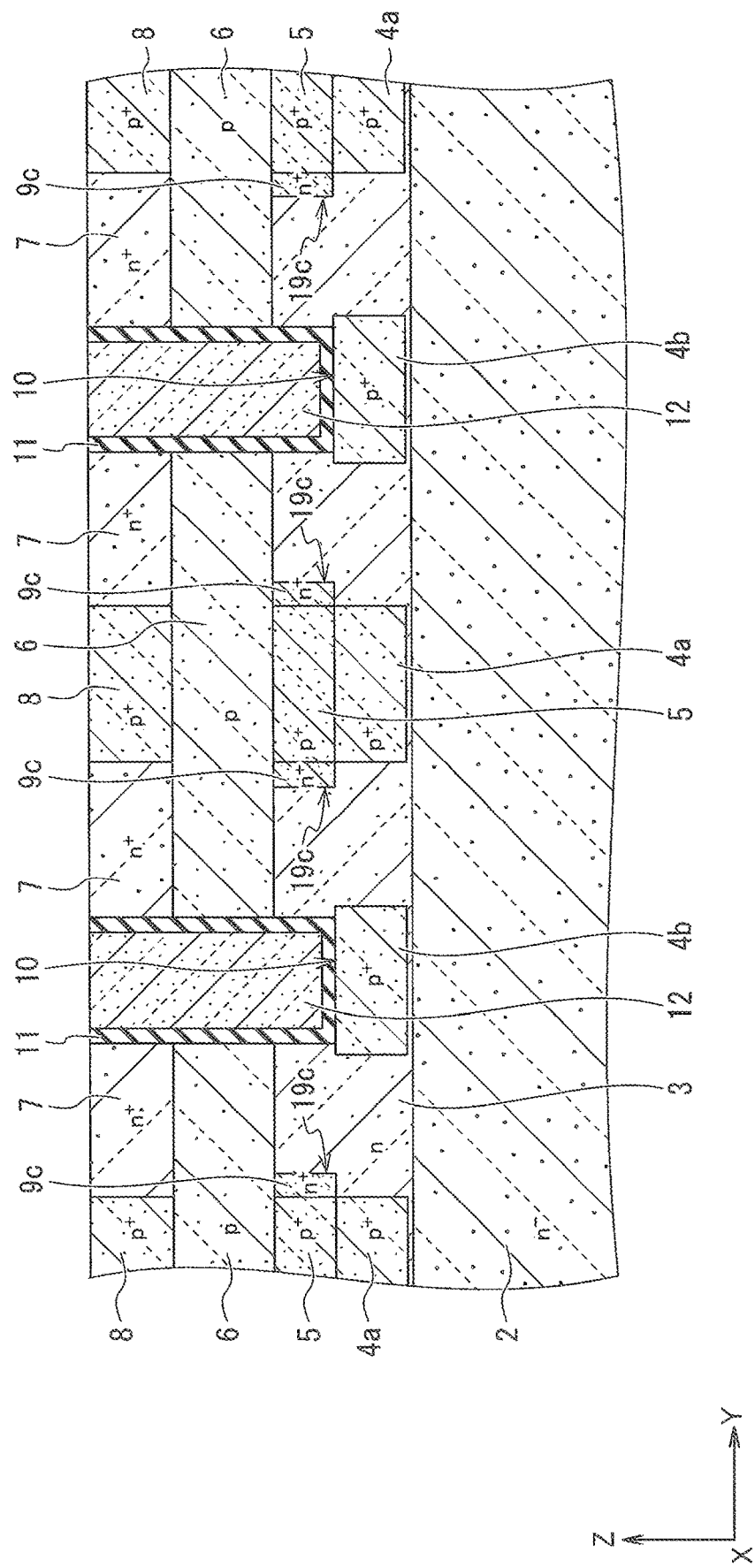
FIG. 18 is a schematic cross-sectional view illustrating another example of the semiconductor device according to the first embodiment.

Further, the second current spreading layer 9 is provided on the side surface of the first embedded region 4a of the base-bottom embedded region (4a, 5), but is not limited. As illustrated in FIG. 16, an n$^+$-type second current spreading layer 9a having a side surface 19a perpendicular to the Y direction is formed on the entire surface of the side surface of the base-bottom embedded region (4a, 5), that is, so as to be connected from the side surface of the first embedded region 4a to the side surface of the second embedded region 5. In such case, after the process of forming the second embedded region 5 illustrated in FIG. 8, n-type impurity ions such as nitrogen (N) may be selectively implanted into the n-ion implanted layer 5p from the top surface of the n-ion implanted layer 5p by multiple-energy ion implantation so as to be in contact with the second embedded region 5. Further, as illustrated in FIG. 17, an n$^+$-type second current spreading layer 9b having a side surface 19b perpendicular to the Y direction may be provided only on a lower portion of the side surface of the first embedded region 4a. The area of the side surface 19b is decreased, but the electric field strength can be increased. Alternatively, as illustrated in FIG. 18, an n$^+$-type second current spreading layer 9c having a side surface 19c perpendicular to the Y direction may be provided on the entire side surface of the second embedded region 5. In addition, each of the second current spreading layers 9a, 9b, 9c may be continuously provided in the longitudinal direction of the trench, that is the X direction, or may be selectively provided in the X direction.

Second Embodiment

<Structure of Semiconductor Device>

Figure 19:
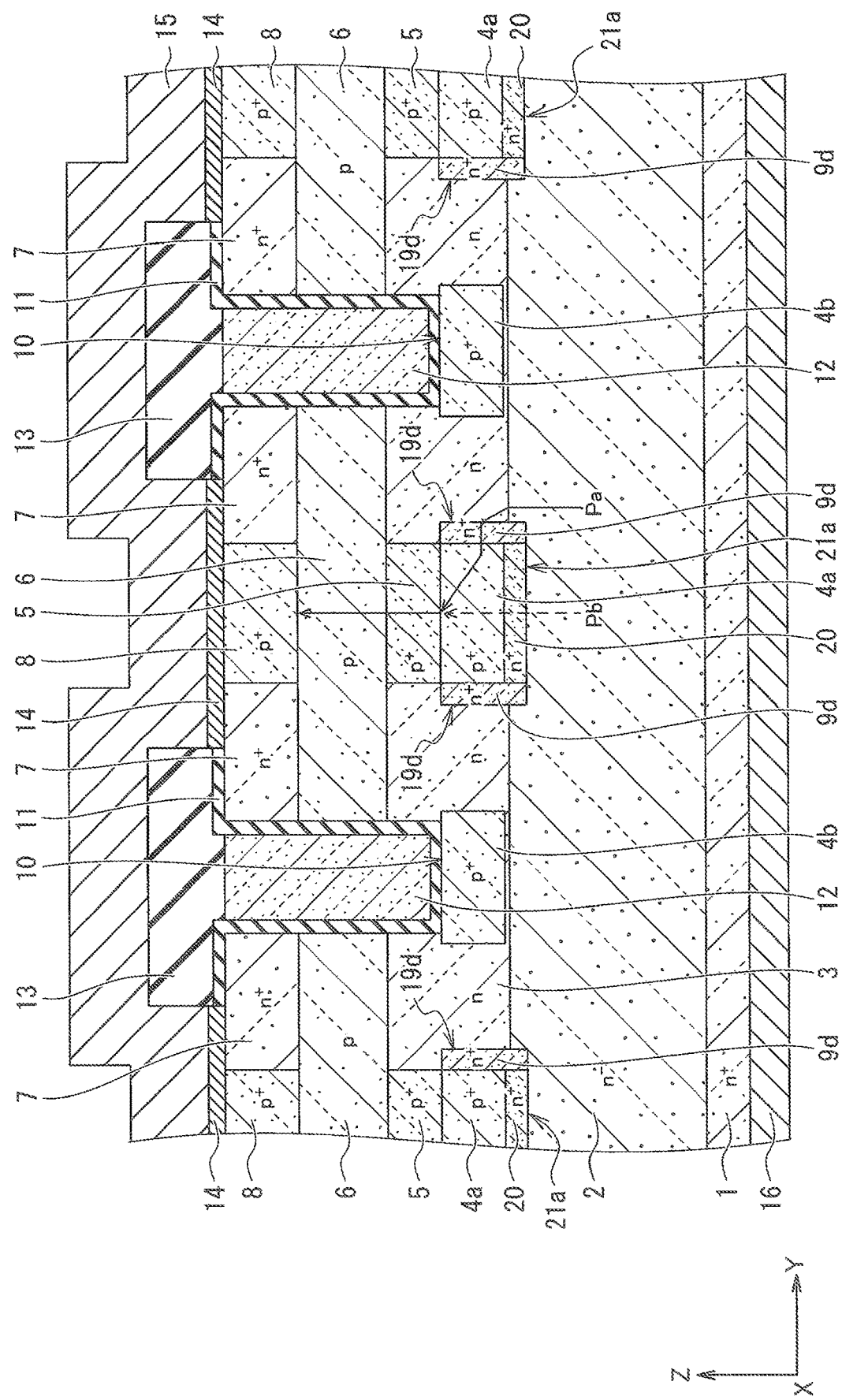
FIG. 19 is a schematic cross-sectional view illustrating an example of a semiconductor device according to a second embodiment.

As illustrated in FIG. 19, in a semiconductor device according to a second embodiment, an n$^+$-type second current spreading layer 9d having a higher impurity concentration than the first current spreading layer 3 is provided to be in contact with the side surface of the first embedded region 4a of the base-bottom embedded region (4a, 5) in the first current spreading layer 3. Further, an n⁺-type third current spreading layer 20 having a higher impurity concentration than the first current spreading layer 3 is provided on an upper portion of the drift layer 2 so as to be in contact with the bottom surface of the first embedded region 4a. The third current spreading layer 20 is metallurgically connected to the second current spreading layer 9d. The second current spreading layer 9d has a side surface 19d facing the gate-bottom protection region 4b. The third current spreading layer 20 has a bottom surface 21a facing the drain region 1. The direction perpendicular to the side surface 19d of the second current spreading layer 9d is the Y direction orthogonal to the c-axis. The direction perpendicular to the bottom surface 21a of the third current spreading layer 20 is the Z direction parallel to the c-axis. The semiconductor device according to the second embodiment differs from the first embodiment in that the third current spreading layer 20 is provided in contact with the bottom surface of the first embedded region 4a. Since other configurations of the semiconductor device according to the second embodiment are the same as those of the first embodiment, duplicate description will be omitted.

As illustrated in FIG. 19, the side surface and the bottom surface of the first embedded region 4a are covered with the second and third current spreading layers 9d, 20. Thus, by adding the third current spreading layer 20, the electric field strength around the first embedded region 4a can be further increased. The side surface 19d of the second current spreading layer 9d is a plane having an orientation orthogonal to the c-axis, and the dielectric breakdown electric field is lower than the bottom surface 21a of the third current spreading layer 20 which is a plane having an orientation parallel to the c-axis. Therefore, the avalanche breakdown occurs by the side surface 19d of the second current spreading layer 9d having a low dielectric breakdown electric field strength, and the avalanche current may flow passing the inside of the embedded region 4a via the side surface 19d of the second current spreading layer 9d as in the first embodiment. Also in the second embodiment, since the avalanche current flows so aa to avoid the gate-bottom protection region 4b, it is possible to prevent dielectric breakdown of the gate insulating film 11.

<Manufacturing Method of Semiconductor Device>

Next, a manufacturing method of the SiC semiconductor device according to the second embodiment will be given by taking a trench gate MOSFET as an example, with reference to the cross-sectional views of FIGS. 20 to 23. Note that the manufacturing method of the trench gate MOSFET described below is merely an example and may be achieved by various other manufacturing methods including a modification as long as the gist described in the claims is included.

First, the n⁺-type SiC semiconductor substrate (substrate) 1p in which n-type impurities such as nitrogen (N) is doped. The top surface of the substrate 1p is a (0001) plane. The n-type drift layer 2 is epitaxially grown on the top surface of the substrate 1p. Then, a photoresist film is applied to the top surface of the drift layer 2, and a mask pattern is delineated to the photoresist film by photolithography technique and the like. Using the delineated photoresist film as an ion-implantation mask, n-type impurity ions such as nitrogen (N) are selectively implanted into the drift layer 2 from the upper side of the drift layer 2. Thus, the n-type n-ion implanted layer 3p is formed on the upper portion of the drift layer 2.

Figure 20:
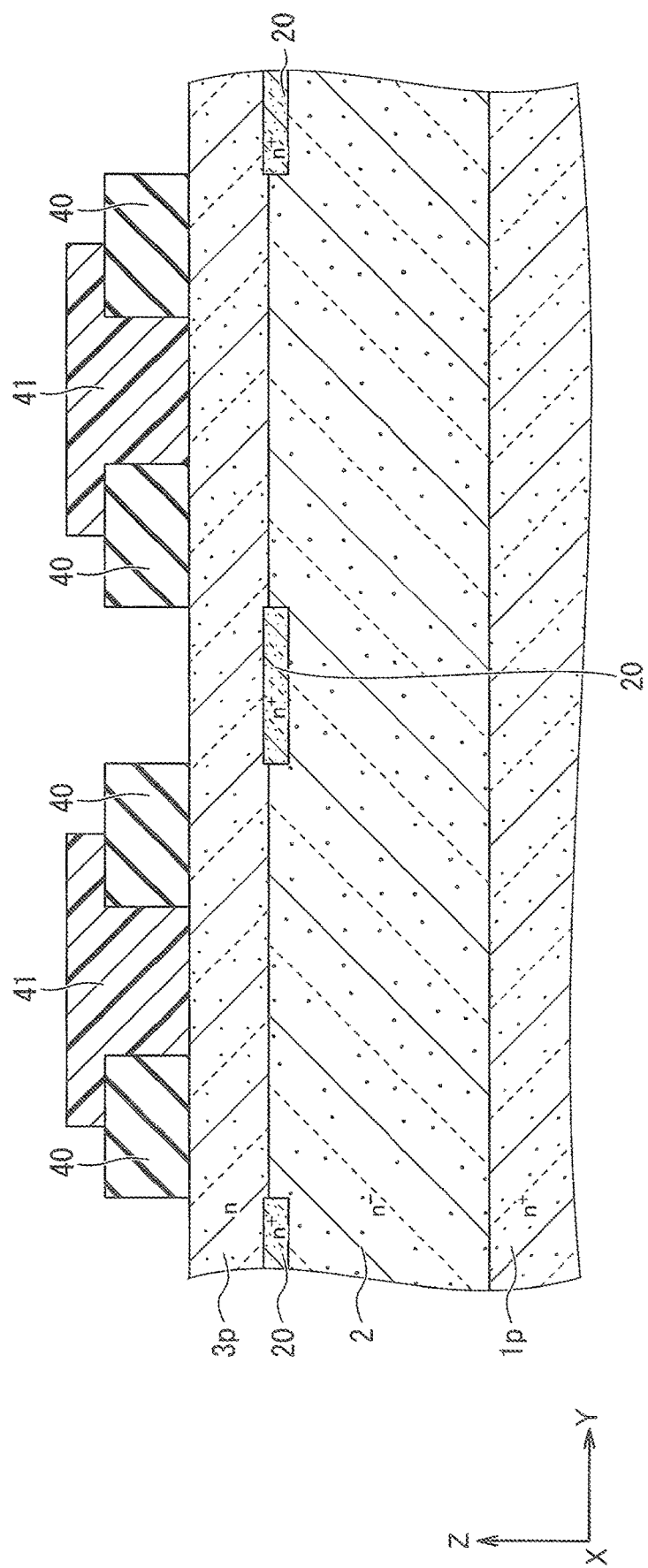
FIG. 20 is a schematic cross-sectional view illustrating an example of a process in a manufacturing method of the semiconductor device according to the second embodiment.

An oxide film made of $SiO_2$ is deposited on the top surface of the n-ion implanted layer 3p by CVD technique and the like. A photoresist film is applied to a top surface of the oxide film, and a mask pattern is delineated to the oxide film by photolithography technique, dry etching technique and the like. A photoresist film is further applied to the top surfaces of the delineated oxide film 40 and the n-ion implanted layer 3p, and another mask pattern is delineated to the photoresist film by photolithography technique and the like. Using the delineated photoresist film 41 as an ion-implantation mask, n-type impurity ions such as nitrogen (N) are selectively implanted from the upper side of the n-ion implanted layer 3p to an upper portion of the drift layer 2 on the interface between the n-ion implanted layer 3p and the drift layer 2 by multiple-energy ion implantation. Thus, as illustrated in FIG. 20, the n⁺-type third current spreading layer 20 is formed on the upper portion of the drift layer 2.

Figure 21:
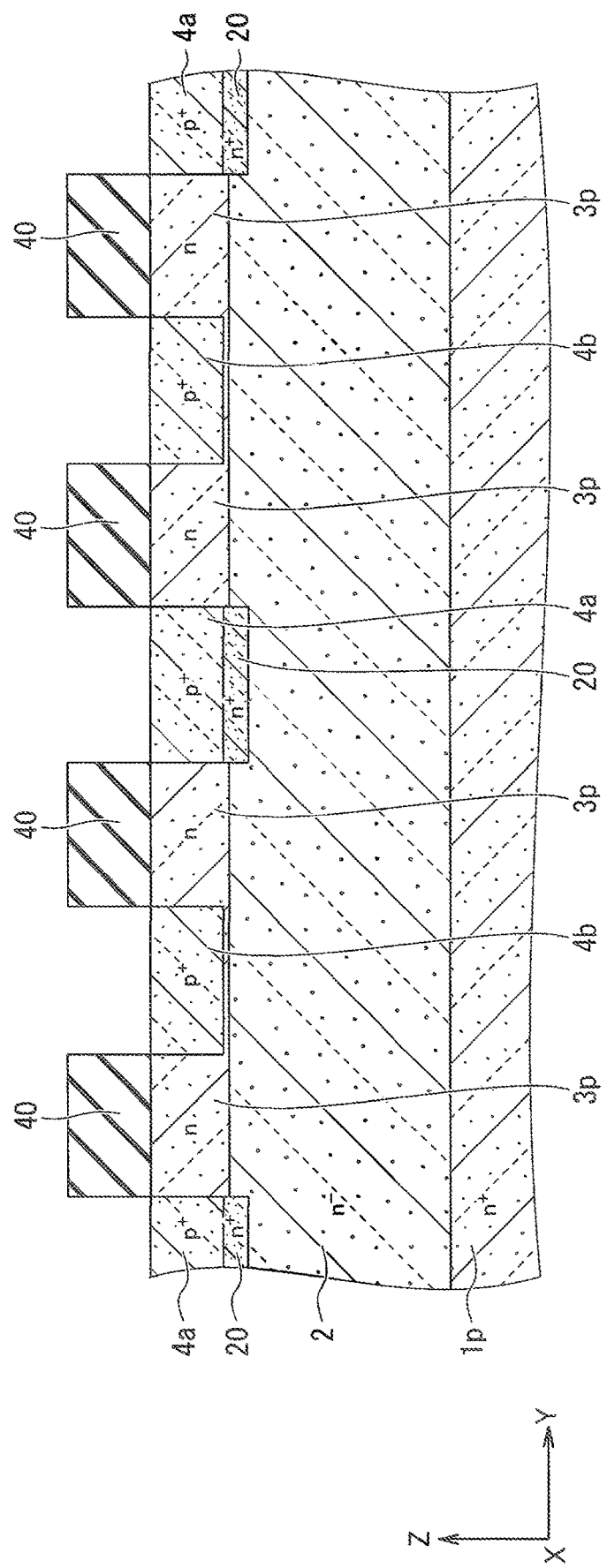
FIG. 21 is a schematic cross-sectional view illustrating an example of a process following FIG. 20 in the manufacturing method of the semiconductor device according to the second embodiment.

After removing the photoresist film 41, the oxide film 40 is used as an ion-implantation mask, and p-type impurity ions such as aluminum (Al) are selectively implanted into the n-ion implanted layer 3p by multiple-energy ion implantation. As a result, as illustrated in FIG. 21, the p⁺-type first embedded region 4a and the p⁺-type gate-bottom protection region 4b are selectively formed on the upper portion of the n-ion implanted layer 3p. The first embedded region 4a is formed so as to be in contact with the top surface of the third current spreading layer 20.

Figure 22:
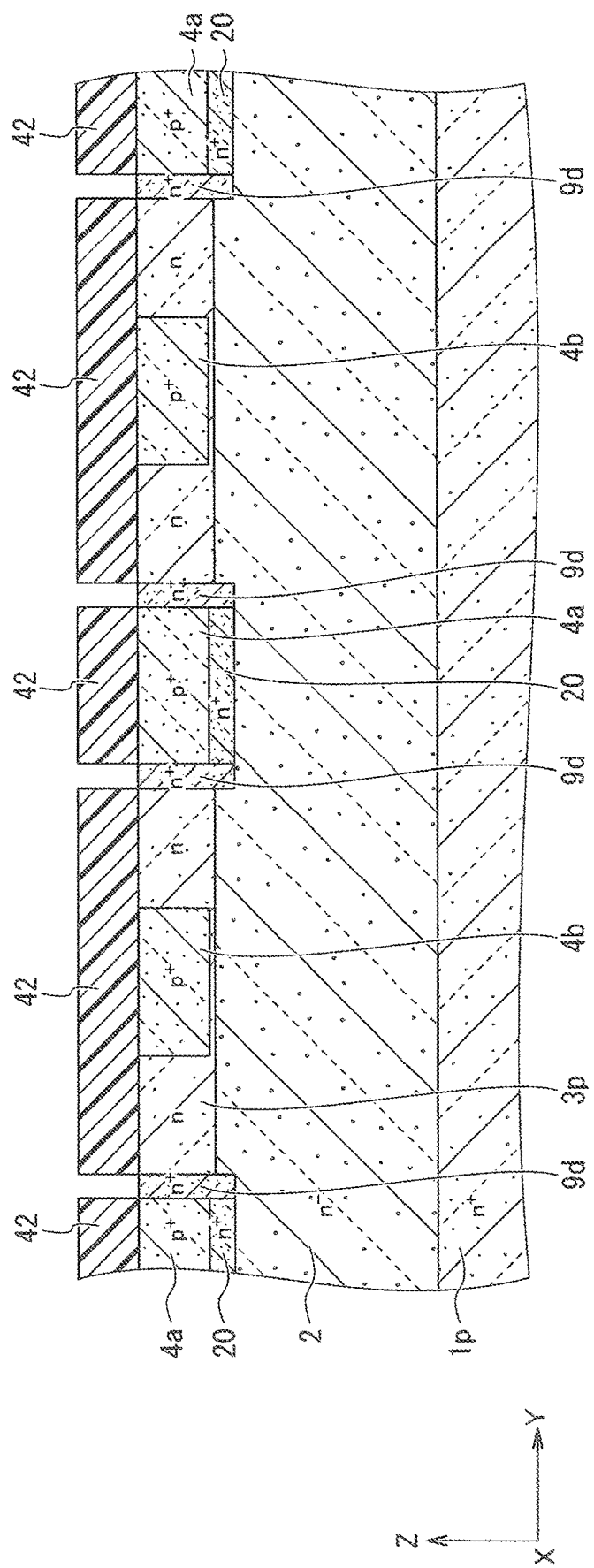
FIG. 22 is a schematic cross-sectional view illustrating an example of a process following FIG. 21 in the manufacturing method of the semiconductor device according to the second embodiment.

After removing the oxide film 40, a photoresist film is applied to the top surfaces of the n-ion implanted layer 3p, the first embedded region 4a and the gate-bottom protection region 4b, and a mask pattern is delineated to the photoresist film by photolithography technique and the like. Using the delineated photoresist film 42 as an ion-implantation mask, n-type impurity ions such as nitrogen (N) are selectively implanted into the n-ion implanted layer 3p so as to be in contact with the first embedded region 4a. As a result, as illustrated in FIG. 22, the n⁺-type second current spreading layer 9d is selectively formed on the side surface of the first embedded region 4a perpendicular to the Y direction. The second current spreading layer 9d is formed so as to extend from the top to the bottom on the entire side surface of the first embedded region 4a so as to be connected to the third current spreading layer 20.

Figure 23:
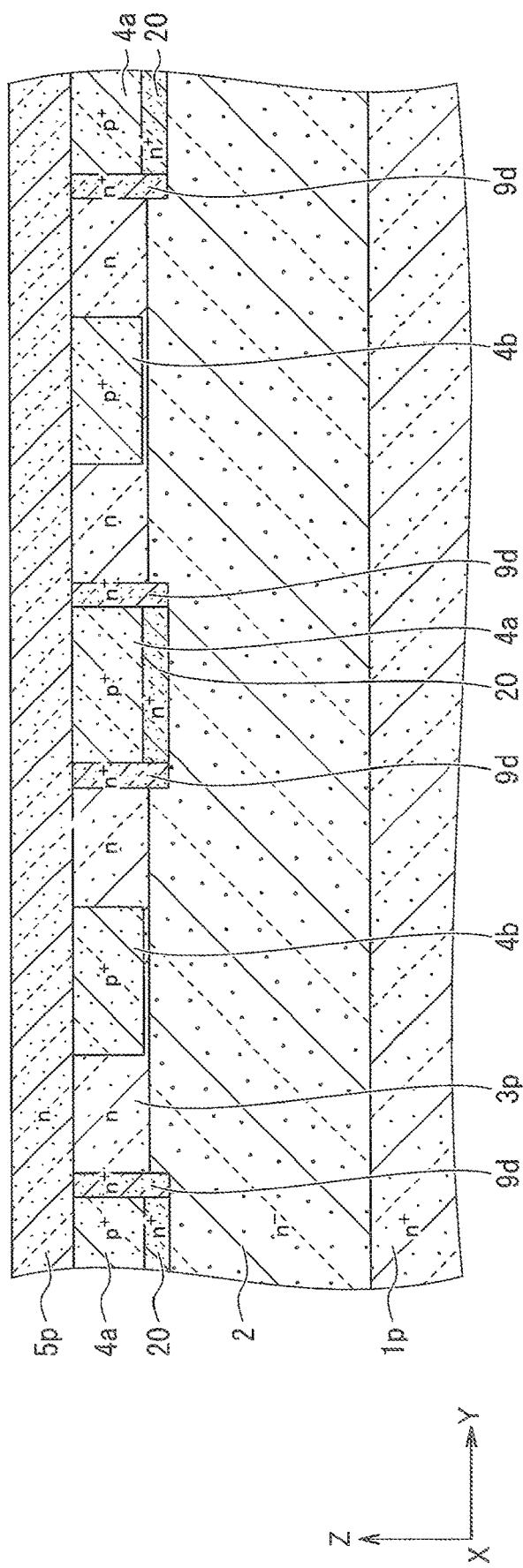
FIG. 23 is a schematic cross-sectional view illustrating an example of a process following FIG. 22 in the manufacturing method of the semiconductor device according to the second embodiment.

After removing the photoresist film 42, an n-type epitaxial layer is grown on the top surfaces of the n-ion implanted layer 3p, the second current spreading layer 9, the first embedding region 4a and the gate-bottom protection region 4b. A photoresist film is applied to a top surface of the epitaxial layer, and a mask pattern is delineated to the photoresist film by photolithography technique and the like. Using the delineated photoresist film as an ion-implantation mask, n-type impurity ions such as nitrogen (N) are selectively implanted into the upper portion of the epitaxial layer from the upper side of the epitaxial layer. As a result, as illustrated in FIG. 23, the n-ion implanted layer 5p is formed on the n-ion implanted layer 3p, the second current spreading layer 9d, the first embedded region 4a and the gate-bottom protection region 4b. Thereafter, the similar process steps as the manufacturing processes of the first embodiment illustrated in FIGS. 8 to 15 are carried out to complete the trench gate semiconductor device illustrated in FIG. 19.

Figure 24:
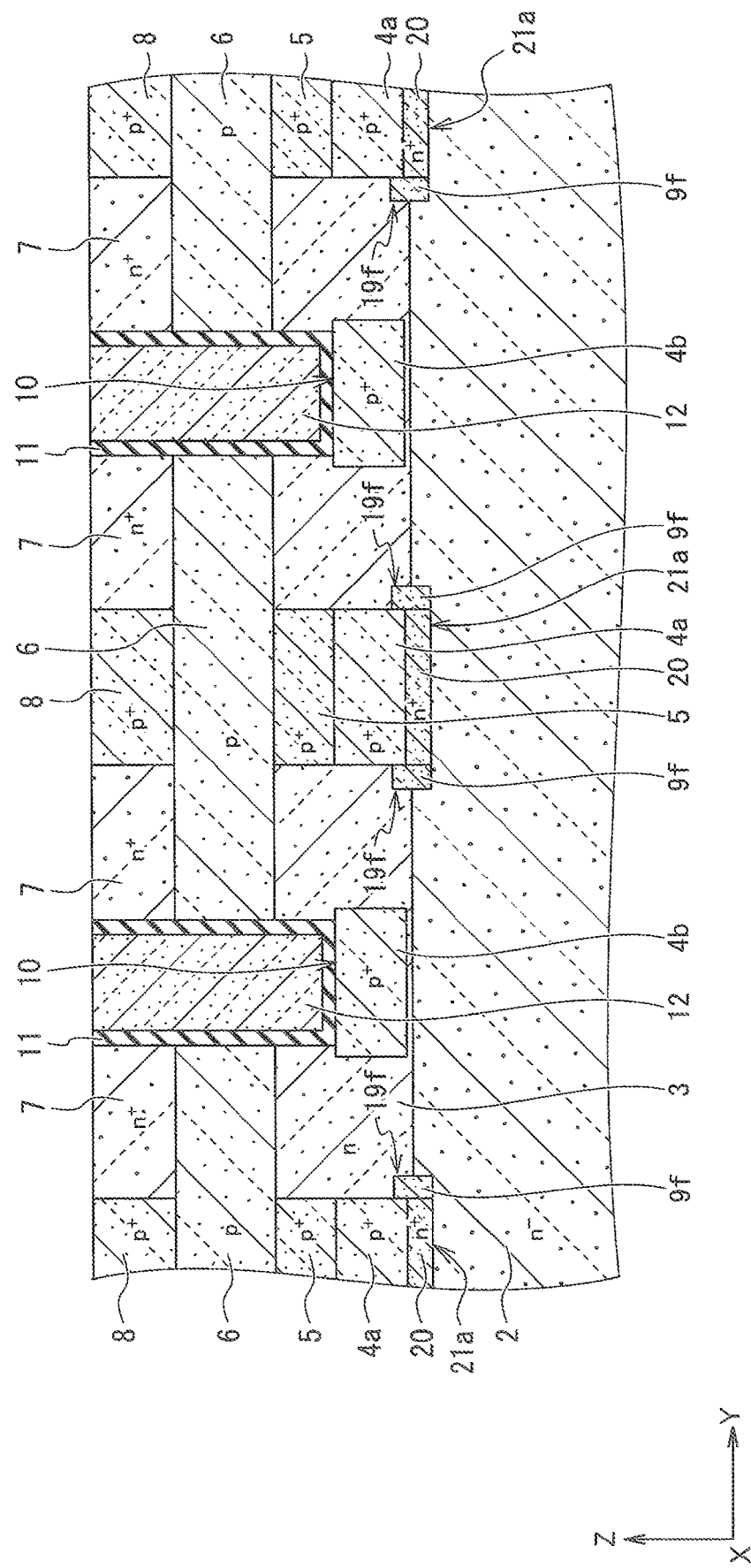
FIG. 24 is a schematic cross-sectional view illustrating another example of the semiconductor device according to the second embodiment.

The second current spreading layer 9d is provided on the entire side surface of the first embedded region 4a of the base-bottom embedded region (4a, 5), but may be provided on a part of the side surface of the first embedded region 4a. For example, as illustrated in FIG. 24, an n⁺-type second current spreading layer 9f having a side surface 19f perpendicular to the Y direction may be provided only on a part of the side surface in the bottom portion of the first embedded region 4a. Further, although the third current spreading layer 20 is provided on the entire bottom surface of the first embedded region 4a, the third current spreading layer 20 may be partially provided. In such case, the avalanche breakdown easily occurs at the boundary portion of the third current spreading layer 20. In addition, the structures above the source region 7 and the base contact region 8 are omitted in FIG. 24. The second current spreading layer 9f is connected to the third current spreading layer 20. The area of the side surface 19f is decreased, but the electric field strength can be increased.

Other Embodiments

While the insulated gate semiconductor devices according to the embodiments of the present invention have been described, it should be understood that the present invention is not intended to be limited to the descriptions of the specification and the drawings implementing part of this disclosure. Various alternative embodiments, examples, and technical applications will be apparent to those skilled in the art according to this disclosure.

Figure 25:
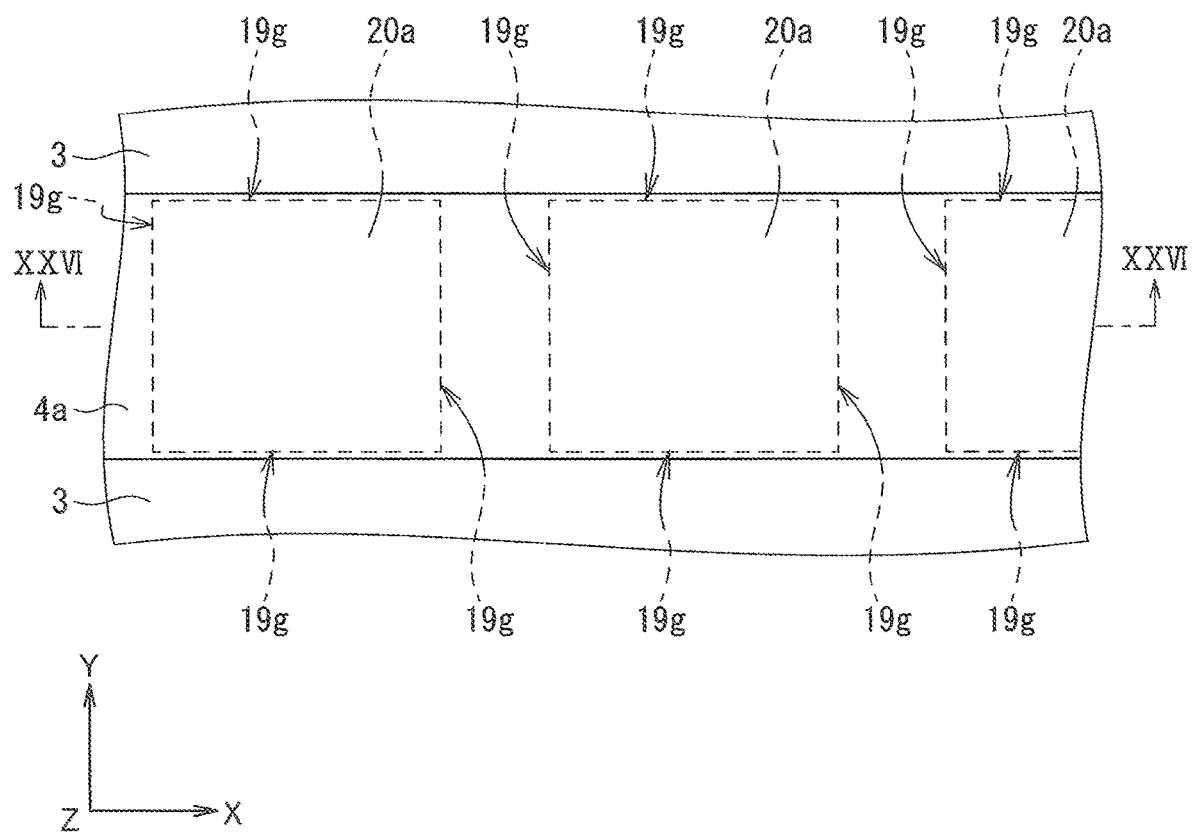
FIG. 25 is a schematic plan view illustrating an example of a semiconductor device according to other embodiment.
Figure 26:
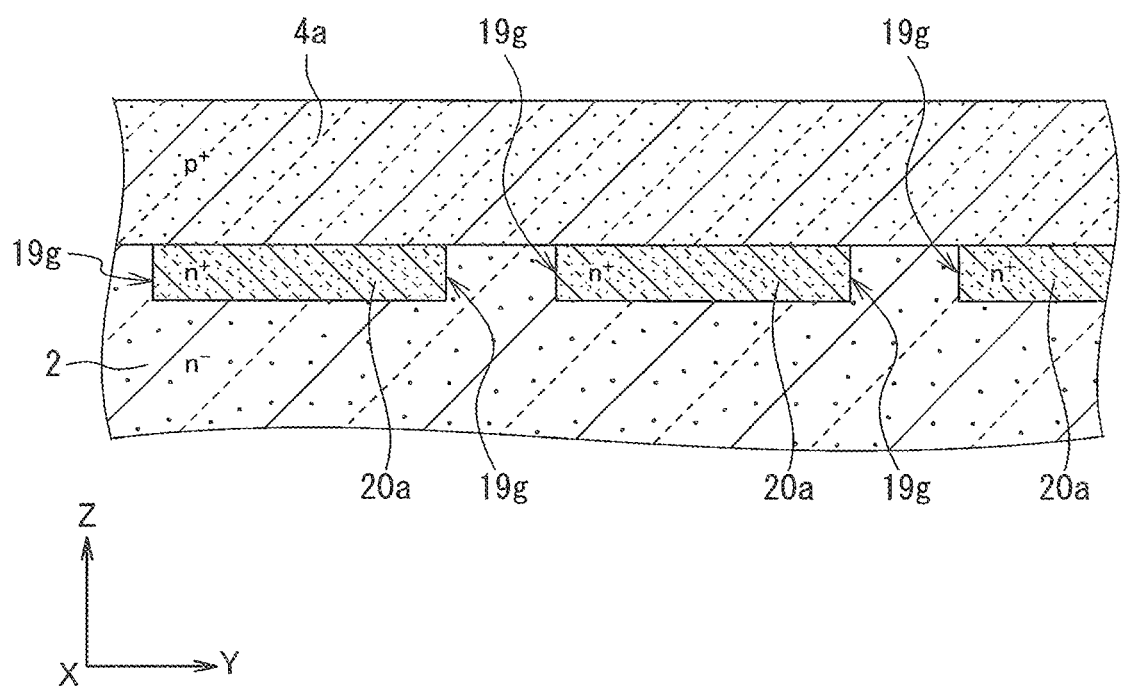
FIG. 26 is a schematic cross-sectional view taken along the line XXVI-XXVI in FIG. 25.

Although the third current spreading layer 20 is provided in the semiconductor device according to the second embodiment, a plurality of third current spreading layers may be provided. For example, as illustrated in FIGS. 25 and 26, a plurality of rectangular third current spreading layers 20a are provided in contact with the bottom surface of the first embedded region 4a. Each side surface 19g of the third current spreading layers 20a is a plane perpendicular to the Y direction. Therefore, the avalanche current can be directed into the side surface 19g of the third current spreading layer 20.

Figure 27:
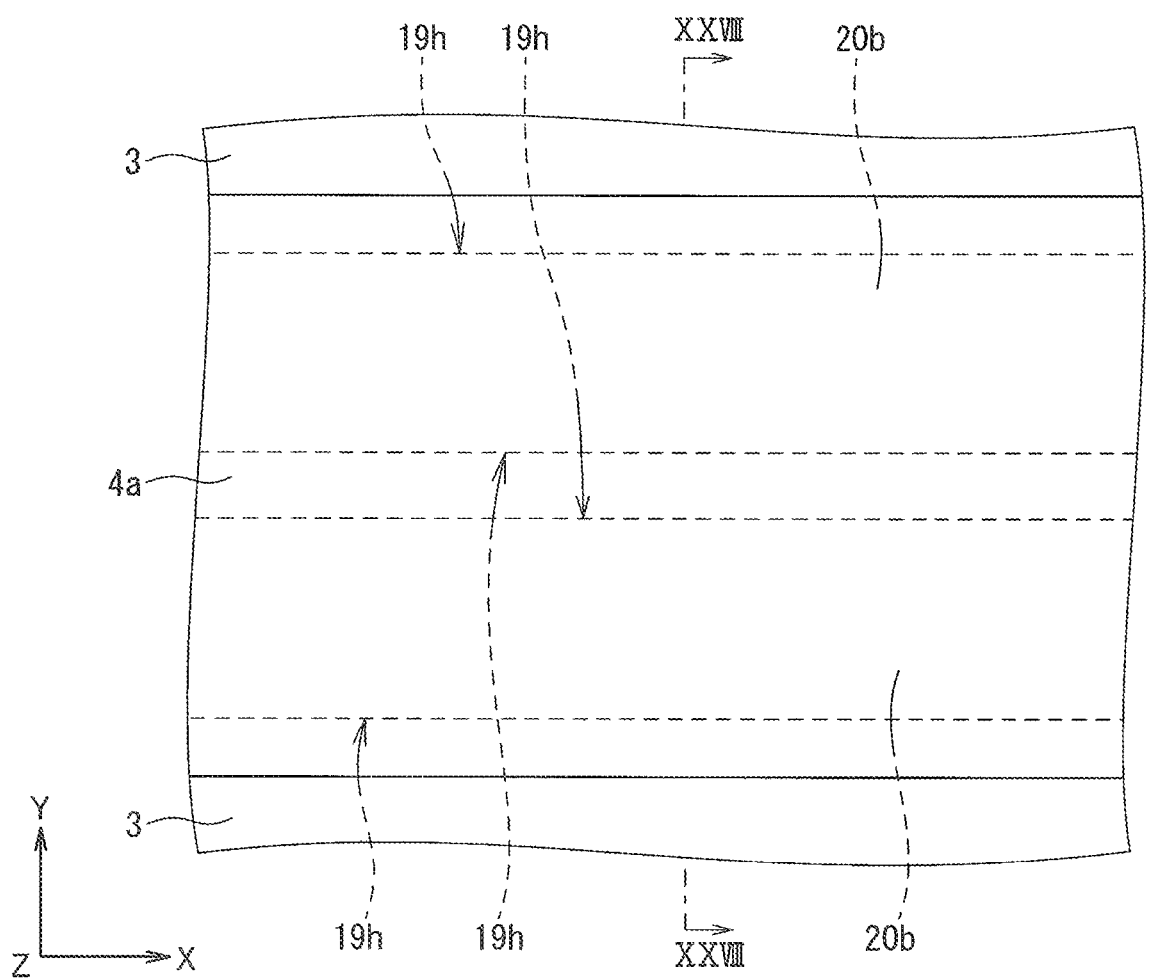
FIG. 27 is a schematic plan view illustrating another example of the semiconductor device according to the other embodiment.
Figure 28:
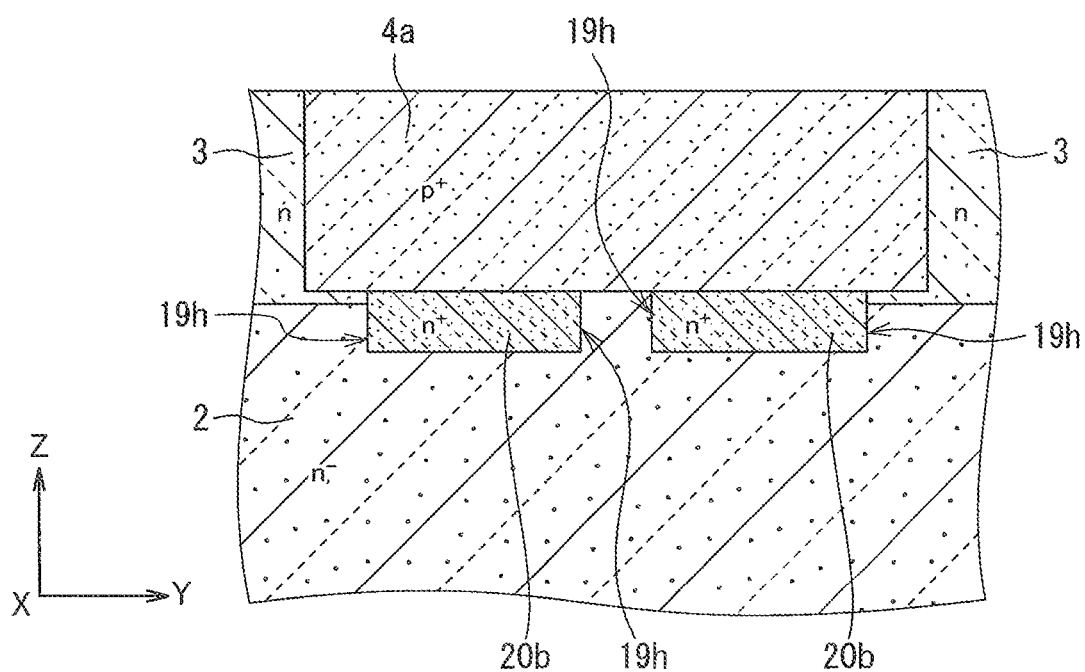
FIG. 28 is a schematic cross-sectional view taken along the line XXVIII-XXVIII in FIG. 27.

Further, as illustrated in FIGS. 27 and 28, two third current spreading layers 20b extending in a stripe shape may be provided in contact with the bottom surface of the first embedded region 4a. Each side surface 19h of the third current spreading layers 20b is a plane perpendicular to the Y direction. Therefore, the avalanche current can be directed into the side surface 19h of the third current spreading layer 20b. In FIG. 27, two third current spreading layers 20b are illustrated, but a number of the third current spreading layers 20b may be three or more.

Note that each of the third current spreading layers 20a, 20b illustrated in FIGS. 25 to 28 may be connected to the second current spreading layer, which is omitted in figures. Alternatively, the second current spreading layer may not be provided, and only the respective third current spreading layers 20a, 20b may be used.

As described above, it should be noted that the present invention includes various embodiments, which are not disclosed herein, including elements optionally modified as alternatives to those illustrated in the above embodiments and modified examples. For example, a concentration distribution inside the base-bottom embedded region (4a, 5) may be designed such that the avalanche breakdown occurs by the side surface of the base-bottom embedded region (4a, 5). Therefore, the scope of the present invention is defined only by the technical features specifying the invention prescribed by the claims reasonably derived from the description heretofore.

What is claimed is:

1. A semiconductor device comprising:
   a drift layer of a first conductivity type made of a hexagonal semiconductor having a wider bandgap than silicon;
   a first current spreading layer of the first conductivity type provided on a top surface of the drift layer, having a higher impurity concentration than the drift layer;
   a base region of a second conductivity type provided on a top surface of the first current spreading layer;
   a gate-bottom protection region of the second conductivity type provided inside the first current spreading layer, having a side surface and a bottom surface which are in contact with the first current spreading layer;
   a base-bottom embedded region of the second conductivity type provided in the first current spreading layer, separated from the gate-bottom protection region and in contact with a bottom surface of the base region;
   a second current spreading layer of the first conductive type having a side surface opposed to the gate-bottom protection region and in contact with a side surface of the base-bottom embedded region; and
   an insulated-gate electrode structure provided in a trench penetrating the base region to reach the gate-bottom protection region, wherein
   an impurity concentration ratio of the gate-bottom protection region to the first current spreading layer is greater than an impurity concentration ratio of the base-bottom embedded region to the second current spreading layer.

2. The semiconductor device of claim 1, wherein the hexagonal semiconductor is silicon carbide and the top surface of the drift layer is a (0001) plane.

3. The semiconductor device of claim 1, wherein the gate-bottom protection region and the base-bottom embedding region have the same impurity concentration and the second current spreading layer has a higher impurity concentration than the first current spreading layer.

4. The semiconductor device of claim 1, wherein the second current spreading layer is provided on the entire side surface of the base bottom embedded region.

5. The semiconductor device of claim 1, wherein the second current spreading layer is in contact with a corner portion of a bottom of the base-bottom embedded region.

6. The semiconductor device of claim 1, wherein
   the base-bottom embedded region has a first embedded region of the second conductivity type provided at the same depth level as the gate-bottom protection region, and a second embedded region of the second conductivity type having a bottom surface in contact with a top surface of the first embedded region and having a top surface in contact with the bottom surface of the base region, and
   the second current spreading layer is in contact with a side surface of the first embedded region.

7. The semiconductor device of claim 1, wherein
   the base-bottom embedded region has a first embedded region of the second conductivity type provided at the same depth level as the gate-bottom protection region, and a second embedded region of the second conductivity type having a bottom surface in contact with a top surface of the first embedded region and having a top surface in contact with the bottom surface of the base region, and
   the second current spreading layer is in contact with a side surface of the second embedded region.

8. The semiconductor device of claim 1, further comprising a third current spreading layer of the first conductivity type in contact with the bottom surface of the base-bottom embedded region, having a higher impurity concentration than the first current spreading layer.

9. The semiconductor device of claim 8, wherein the third current spreading layer is implemented by a plurality of layers separated from each other.

10. The semiconductor device of claim 1, further comprising a connecting portion of the second conductivity type coupling the gate-bottom protection region and the base-bottom embedded region,
   wherein the second current spreading layer is also provided on a side wall of the connecting portion.

11. The semiconductor device of claim 1, wherein
   the first current spreading layer and the second current spreading layer have the same impurity concentration, and
   the gate-bottom protection region has a higher impurity concentration than the base-bottom embedded region.

* * * * *